US012764975B2

(12) United States Patent
Park et al.

(10) Patent No.: US 12,764,975 B2
(45) Date of Patent: Oct. 13, 2026

(54) THREE-DIMENSIONAL NON-VOLATILE MEMORY DEVICE WITH REDUCED CHIP SIZE

(71) Applicant: Samsung Electronics Co., Ltd., Suwon-si (KR)

(72) Inventors: Jooyong Park, Suwon-si (KR); Seungyeon Kim, Suwon-si (KR); Daeseok Byeon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 387 days.

(21) Appl. No.: 18/366,723

(22) Filed: Aug. 8, 2023

(65) Prior Publication Data

US 2024/0065004 A1 Feb. 22, 2024

(30) Foreign Application Priority Data

Aug. 17, 2022 (KR) ........................ 10-2022-0102947

(51) Int. Cl.

| | |
|---|---|
| ***H10B 80/00*** | (2026.01) |
| ***H10B 43/27*** | (2023.01) |
| ***H10B 43/35*** | (2023.01) |
| ***H10W 90/00*** | (2026.01) |

(52) U.S. Cl.

CPC ............. *H10B 80/00* (2023.02); *H10B 43/27* (2023.02); *H10B 43/35* (2023.02); *H10W 90/00* (2026.01); *H10W 90/792* (2026.01)

(58) Field of Classification Search

CPC ........ H10B 80/00; H10B 43/35; H10B 43/27; H01L 24/08; H01L 25/0657; H01L 25/18; H01L 2224/08145; H01L 2924/1431; H01L 2924/14511

See application file for complete search history.

(56) References Cited

U.S. PATENT DOCUMENTS

| | | | |
|---|---|---|---|
| 11,087,844 | B2 | 8/2021 | Kim et al. |
| 11,289,467 | B2 | 3/2022 | Kwon et al. |
| 11,315,914 | B2 | 4/2022 | Sung et al. |
| 11,348,910 | B2 | 5/2022 | Kim et al. |

(Continued)

FOREIGN PATENT DOCUMENTS

| | | | | |
|---|---|---|---|---|
| CN | 118695599 A * | 9/2024 | | ............ H10B 43/27 |
| KR | 10-2018-0066650 A | 6/2018 | | |

(Continued)

*Primary Examiner* — Eliseo Ramos Feliciano
*Assistant Examiner* — Timothy Edward Duren
(74) *Attorney, Agent, or Firm* — Wolf, Greenfield & Sacks, P.C.

(57) ABSTRACT

A non-volatile memory device includes a first semiconductor layer including a cell area having a memory cell array and a stair area adjacent to the cell area, and a second semiconductor layer stacked on the first semiconductor layer in a vertical direction and including a row decoder. The first semiconductor layer includes a plurality of word lines stacked in the vertical direction, a layer including at least one string select line stacked on the plurality of word lines, and a plurality of first pass transistors in the stair area and on the layer including the at least one string select line, where, in the stair area, the plurality of word lines have a stepped shape, and the plurality of first pass transistors electrically connect the plurality of word lines to the row decoder.

18 Claims, 15 Drawing Sheets

(56) References Cited

U.S. PATENT DOCUMENTS

| | | | | |
|---|---|---|---|---|
| 2018/0294277 | A1* | 10/2018 | Kim | G11C 8/08 |
| 2021/0242175 | A1 | 8/2021 | Kim et al. | |
| 2021/0327482 | A1 | 10/2021 | Tang et al. | |
| 2022/0005820 | A1 | 1/2022 | Kim et al. | |
| 2022/0122673 | A1* | 4/2022 | Kim | G11C 16/08 |
| 2022/0122932 | A1 | 4/2022 | Oh et al. | |

FOREIGN PATENT DOCUMENTS

| | | | | | |
|---|---|---|---|---|---|
| KR | 20190119811 | A | * | 10/2019 | H01L 24/09 |
| KR | 20210026963 | A | * | 3/2021 | H10D 88/00 |

* cited by examiner

THREE-DIMENSIONAL NON-VOLATILE MEMORY DEVICE WITH REDUCED CHIP SIZE

CROSS-REFERENCE TO RELATED APPLICATION

This application is based on and claims priority under 35 U.S.C. § 119 to Korean Patent Application No. 10-2022-0102947, filed on Aug. 17, 2022, in the Korean Intellectual Property Office, the disclosure of which is incorporated by reference herein in its entirety.

FIELD

The inventive concept relates to a memory device, and more particularly, to a three-dimensional non-volatile memory device in which a memory cell array overlaps a partial region of a peripheral circuit.

BACKGROUND

Memory devices are used to store data, and may be classified into volatile memory devices and non-volatile memory devices. In response to the demand for high capacity and miniaturization of non-volatile memory devices, a three-dimensional memory device in which a memory cell array and a peripheral circuit are vertically disposed has been developed. In order to increase the capacity of a non-volatile memory device, as the number of word lines stacked on a substrate increases, the area of a cell region in which a memory cell array is arranged may decrease. However, despite the reduction in the area of the cell region, the area of a peripheral circuit region in which a peripheral circuit is disposed under the memory cell array may not decrease. Also, in order to improve the degree of integration of a memory device, as the number of word lines stacked in a vertical direction with respect to a substrate increases, the number of pass transistors connected to the word lines may increase, thereby increasing the chip size of the memory device.

SUMMARY

Embodiments of the inventive concept provide a non-volatile memory device having a reduced chip size while having improved integration.

According to an aspect of the inventive concept, a non-volatile memory device includes a first semiconductor layer comprising a cell area that includes a memory cell array, and a stair area adjacent to the cell area; and a second semiconductor layer stacked on the first semiconductor layer in a vertical direction and comprising a row decoder. The first semiconductor layer includes a plurality of word lines stacked in the vertical direction; a layer comprising at least one string select line stacked on the plurality of word lines; and a plurality of first pass transistors in the stair area and on the layer comprising the at least one string select line. In the stair area, the plurality of word lines have a stepped shape, and the plurality of first pass transistors electrically connect the plurality of word lines to the row decoder.

According to another aspect of the inventive concept, a non-volatile memory device includes a first semiconductor layer comprising a memory cell array that includes a plurality of vertical channel structures; and a second semiconductor layer stacked on the first semiconductor layer in a vertical direction and comprising a row decoder. The first semiconductor layer includes a plurality of word lines stacked in the vertical direction; a layer comprising at least one string select line stacked on the plurality of word lines; and a plurality of pass transistors on the layer comprising the at least one string select line. The plurality of pass transistors electrically connect the plurality of word lines to the row decoder.

According to another aspect of the inventive concept, a non-volatile memory device includes a first semiconductor layer comprising a memory cell array; and a second semiconductor layer stacked on the first semiconductor layer in a vertical direction and comprising a row decoder. The first semiconductor layer includes a plurality of word lines stacked in the vertical direction; a layer comprising at least one string select line between the plurality of word lines and a bonding surface between the first semiconductor layer and the second semiconductor layer; and a plurality of first pass transistors on the layer comprising the at least one string select line. The plurality of first pass transistors electrically connect the plurality of word lines to the row decoder.

BRIEF DESCRIPTION OF THE DRAWINGS

Embodiments will be more clearly understood from the following detailed description taken in conjunction with the accompanying drawings in which.

DETAILED DESCRIPTION OF EMBODIMENTS

Hereinafter, embodiments of the inventive concept will be described in detail with reference to the accompanying drawings. The terms “first,” “second,” etc. may be used herein merely to distinguish one element from another. Elements referred to herein as “connected to” may be electrically and/or physically connected. The terms "comprises," "comprising," "includes" and/or "including," when used herein, specify the presence of stated elements, but do not preclude the presence of additional elements. The term "and/or" includes any and all combinations of one or more of the associated listed items.

Figure 1:
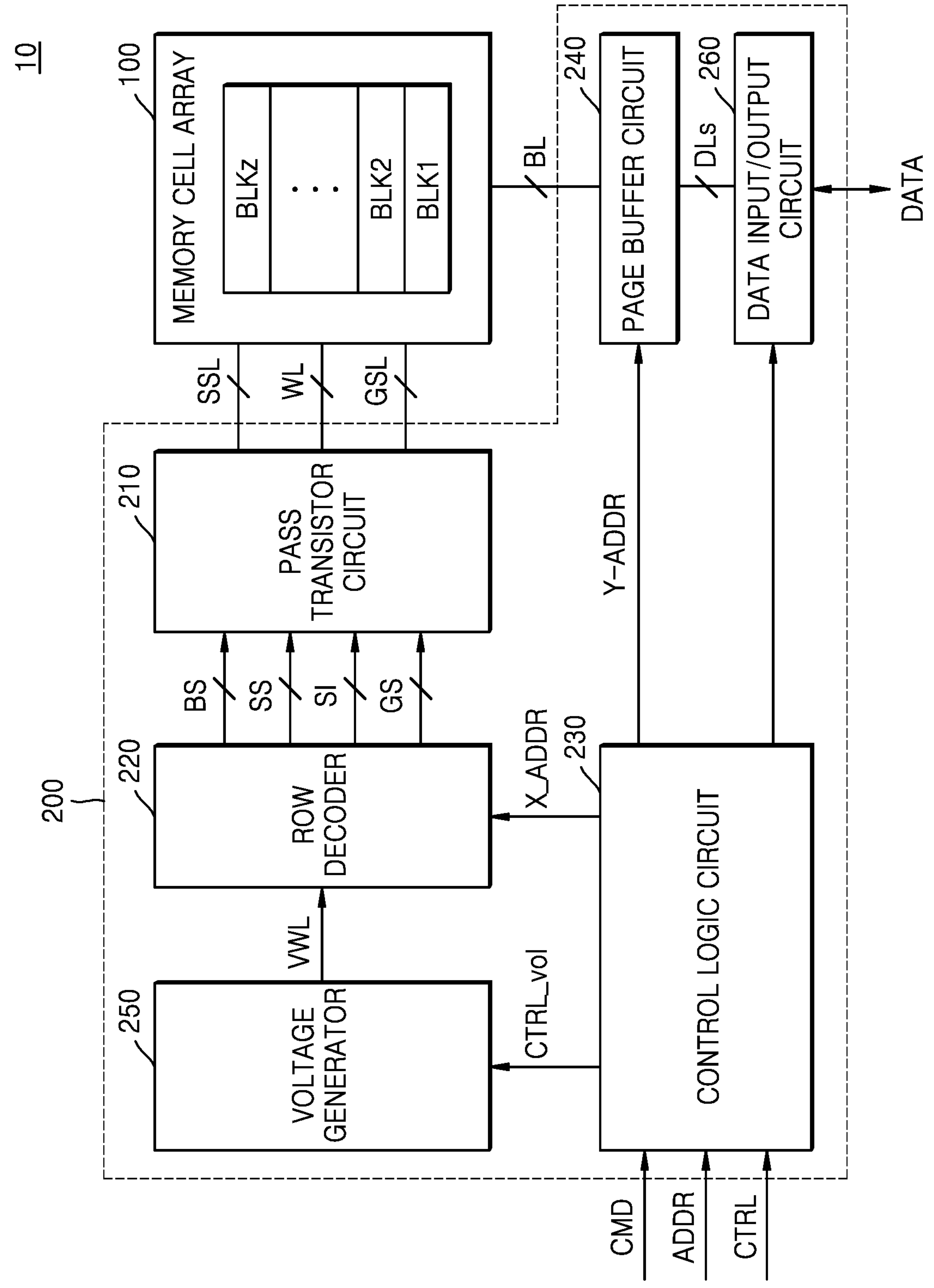
FIG. 1 is a block diagram of a memory device according to an embodiment.

FIG. 1 is a block diagram of a memory device 10 according to an embodiment.

Referring to FIG. 1, the memory device 10 may include a memory cell array 100 and a peripheral circuit 200, and the peripheral circuit 200 may include a pass transistor circuit 210, a row decoder 220, a control logic circuit 230, a page buffer circuit 240, a voltage generator 250, and a data input/output circuit 260. Although not shown in the drawings, the peripheral circuit 200 may further include an input/output interface, a column logic, a pre-decoder, a temperature sensor, a command decoder, an address decoder, or the like. In embodiments, the memory device 10 may be a non-volatile memory device, and hereinafter, "memory device" refers to a non-volatile memory device.

The memory cell array 100 may include a plurality of memory blocks BLK1 to BLKz (z is a positive integer), and each of the plurality of memory blocks BLK1 to BLKz may include a plurality of memory cells. The memory cell array 100 may be connected to the page buffer circuit 240 through bit lines BL, and may be connected to the pass transistor circuit 210 through word lines WL, string select lines SSL, and ground select lines GSL. For example, the memory cells may be flash memory cells. Hereinafter, embodiments will be described with reference to the case in which the memory cells are NAND flash memory cells as an example. However, the inventive concept is not limited thereto, and in some embodiments, the memory cells may be resistive memory cells, such as resistive RAM (ReRAM) cells, phase change RAM (PRAM) cells, or magnetic RAM (MRAM) cells.

In an embodiment, the memory cell array 100 may include a three-dimensional memory cell array, and the three-dimensional memory cell array may include a plurality of NAND strings, each of which may include memory cells respectively connected to word lines stacked vertically on a substrate. This structure will be described later with reference to FIGS. 3 and 4. However, the inventive concept is not limited thereto, and in an embodiment, the memory cell array 100 may include a two-dimensional memory cell array, which may include a plurality of NAND strings arranged in row and column directions.

The pass transistor circuit 210 may be connected to the row decoder 220 through block select signal lines BS, string select line driving signal lines SS, word line driving signal lines SI, and ground select line driving signal lines GS. The string select line driving signal lines SS, the word line driving signal lines SI, and the ground select line driving signal lines GS may be referred to as "driving signal lines". The pass transistor circuit 210 may include a plurality of pass transistors, each of which connects a corresponding one of the driving signal lines to a corresponding one of the word lines WL, the string select lines SSL, and the ground select lines GSL according to block select signals provided through the block select signal lines BS.

The row decoder 220 may output a block select signal for selecting one of the plurality of memory blocks to the block select signal lines BS in response to a row address X-ADDR. Also, in response to the row address X-ADDR, the row decoder 220 may output a word line driving signal for selecting one of the word lines WL of a selected memory block to the word line driving signal lines SI, output a string select line driving signal for selecting one of the string select lines SSL to the string select line driving signal lines SS, and output a ground select line driving signal for selecting one of the ground select lines GSL to the ground select line driving signal lines GS. The page buffer circuit 240 may select some of the bit lines BL in response to a column address Y-ADDR. Specifically, the page buffer circuit 240 operates as a write driver or a sense amplifier according to an operation mode.

The control logic circuit 230 may generate various control signals for programming data into the memory cell array 100, reading data from the memory cell array 100, or erasing data stored in the memory cell array 100, based on a command CMD, an address ADDR, and a control signal CTRL. For example, the control logic circuit 230 may output the row address X-ADDR and the column address Y-ADDR. Accordingly, the control logic circuit 230 may generally control various operations in the memory device 10.

The voltage generator 250 may generate various types of voltages to perform program, read, and erase operations on the memory cell array 100 based on a voltage control signal CTRL_vol. Specifically, the voltage generator 250 may generate a word line voltage VWL, for example, a program voltage, a read voltage, a pass voltage, an erase verification voltage, or a program verification voltage. Also, the voltage generator 250 may further generate a string select line voltage and a ground select line voltage based on the voltage control signal CTRL_vol.

The page buffer circuit 240 may dump data stored in latches to the data input/output circuit 260 through a data line DL under control by the control logic circuit 230. The data input/output circuit 260 may temporarily store data provided from the outside of the memory device 10 (e.g., from an external device) through an input/output line. The data input/output circuit 260 may temporarily store read data of the memory device 10 and output the stored read data to the outside through the input/output line at a specified time.

As the number of stages of memory cells disposed in the memory cell array 100 increases with the development of semiconductor processes, that is, as the number of word lines WL stacked in a vertical direction increases, the number of pass transistors for driving the word lines WL increases, and accordingly, an area occupied by the pass transistor circuit 210 may increase. In the memory device 10 according to the disclosure, the pass transistor circuit 210 may include a plurality of vertical pass transistors disposed in a stair step-shaped area (e.g., a stair area SA of FIG. 2) of the word lines WL. In other words, at least a portion of the pass transistor circuit 210 may be disposed in the stair area of the word lines WL. Accordingly, because an area in which the pass transistor circuit 210 is disposed overlaps the stair area of the word lines WL, even when the number of pass transistors increases according to an increase in the number of stacked word lines WL, an increase in the size of the memory device 10 may be reduced or prevented.

Figure 2:
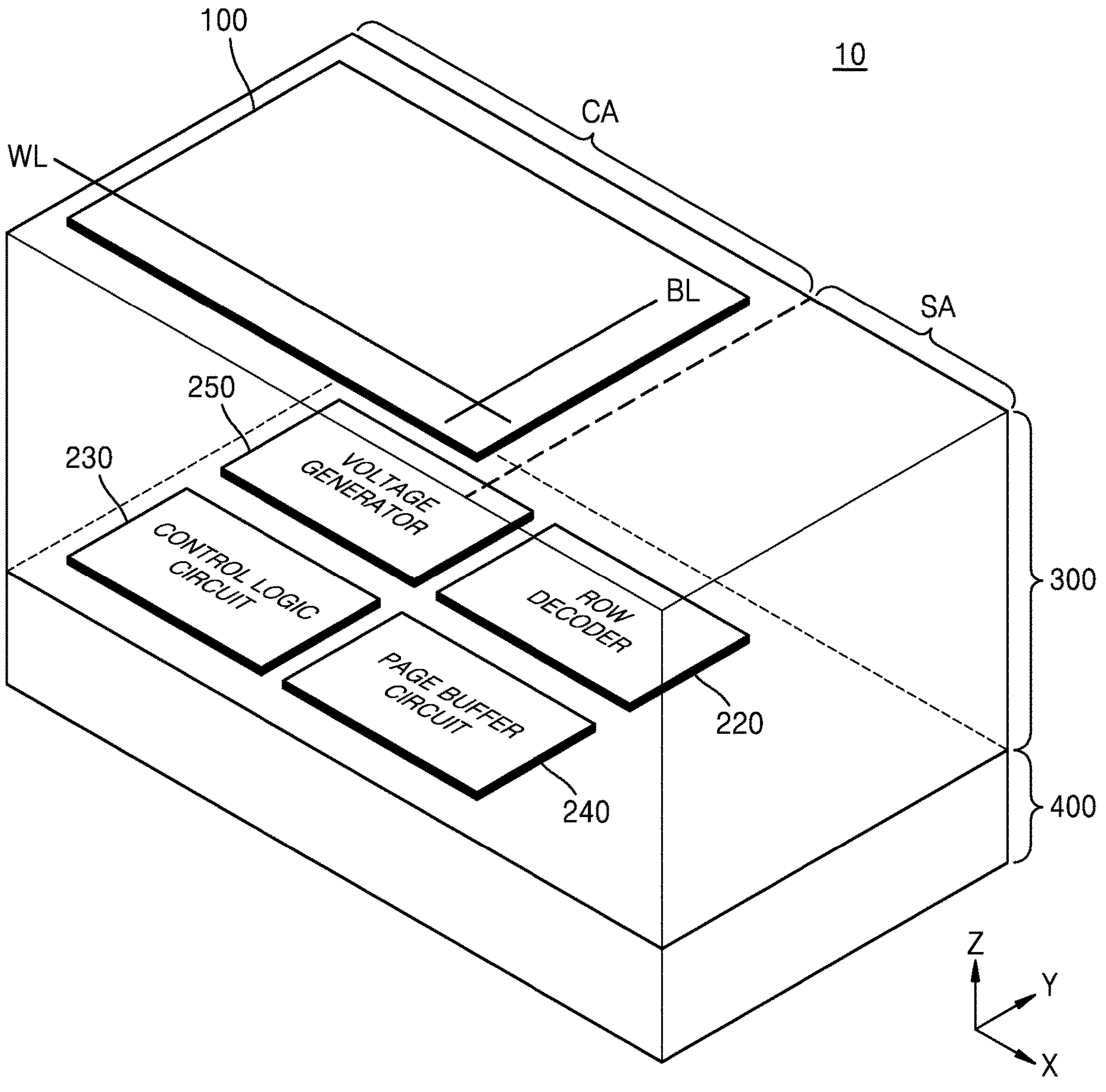
FIG. 2 is a schematic view illustrating the structure of a memory device according to an embodiment.

FIG. 2 is a schematic view illustrating the structure of a memory device 10 according to an embodiment.

Referring to both FIG. 1 and FIG. 2, the memory device 10 may include a first semiconductor layer 300 and a second semiconductor layer 400, and the first semiconductor layer 300 may be stacked on the second semiconductor layer 400 in a direction (e.g., a Z-axis direction) perpendicular to the second semiconductor layer 400. In other words, the second semiconductor layer 400 may be disposed overlapping (e.g., above or below) the first semiconductor layer 300 in a vertical direction. Spatially relative terms, such as "beneath," "below," "lower," "above," "upper," and the like, may be used herein to describe one element's or feature's relationship to another as illustrated in the figures, but are intended to encompass different orientations of the device in use or operation in addition to the orientation depicted in the figures. For example, if the device in the figures is turned over, elements described as "below" or "beneath" other elements or features would then be oriented "above" the other elements or features.

The memory cell array 100 and at least some of the pass transistors included in the pass transistor circuit 210 may be formed in the first semiconductor layer 300, and the row decoder 220, the control logic circuit 230, the page buffer circuit 240, and the voltage generator 250 may be formed in the second semiconductor layer 400. However, the memory device 10 according to the disclosure is not limited thereto. For example, at least some of the circuits constituting the row decoder 220 may be disposed in the first semiconductor layer 300, which is shown as an upper semiconductor layer, together with the memory cell array 100, and some other circuits among the circuits constituting the row decoder 220 may be disposed in the second semiconductor layer 400, which is shown as a lower semiconductor layer, together with the control logic circuit 230 and the page buffer circuit 240.

The pass transistor circuit 210 may include a plurality of pass transistors. In an embodiment, a plurality of first pass transistors (e.g., pass transistors TR2, TR4, TR6, and TRn of FIG. 7) that are at least some of the plurality of pass transistors may be disposed in the first semiconductor layer 300, and each of the plurality of first pass transistors may be a vertical pass transistor having a vertical structure. The vertical pass transistor may refer to a transistor including a vertical channel, and may include a channel formed in a direction (e.g., the Z-axis direction) perpendicular to the main surface of a substrate.

In an embodiment, the pass transistor circuit 210 may include a second pass transistor (e.g., a pass transistor TRs of FIG. 7) disposed in the second semiconductor layer 400, and the second pass transistor may be a normal pass transistor. The normal pass transistor may refer to a transistor including a horizontal channel, and may include a channel formed in a direction (e.g., an X-axis direction or a Y-axis direction) parallel to the main surface of the substrate. However, the inventive concept is not limited thereto, and all pass transistors may be formed in the first semiconductor layer 300.

In an embodiment, each of the first semiconductor layer 300 and the second semiconductor layer 400 may be formed, and then the first semiconductor layer 300 and the second semiconductor layer 400 may be bonded to each other by Cu to Cu (C2C) wafer bonding, thereby forming the memory device 10. For example, a plurality of bonding pads may be formed on a first surface of the first semiconductor layer 300, and a plurality of bonding pads may be formed on a first surface of the second semiconductor layer 400. The plurality of bonding pads of the first semiconductor layer 300 and the plurality of bonding pads of the second semiconductor layer 400 may be physically and electrically connected to each other at an interface therebetween. Each of the first semiconductor layer 300 and the second semiconductor layer 400 may be implemented as a separate chip.

In the first semiconductor layer 300, a plurality of word lines WL may extend in a first horizontal direction (e.g., the X-axis direction), and a plurality of bit lines BL may extend in a second horizontal direction (e.g., the Y-axis direction). Respective ends of the plurality of word lines WL may have or collectively define a stair shape (also referred to herein as a stepped shape), and in the present specification, an area including the plurality of word lines WL having a stair shape in the first semiconductor layer 300 is referred to as a "stair area SA".

A vertical channel structure may be formed in the first semiconductor layer 300 to form a cell area CA that is an area in which memory cells are formed. The memory cell array 100 may be disposed in the cell area CA. The plurality of first pass transistors may be disposed in the stair area SA of the first semiconductor layer 300. Accordingly, in the memory device 10, because an area in which the plurality of first pass transistors are disposed overlaps (e.g., in the perpendicular or vertical direction with respect to the first semiconductor layer 300) the stair area SA of the word lines WL, even when the number of pass transistors increases according to an increase in the number of stacked word lines WL, an increase in the size of the memory device 10 may be reduced or prevented.

Figure 3:
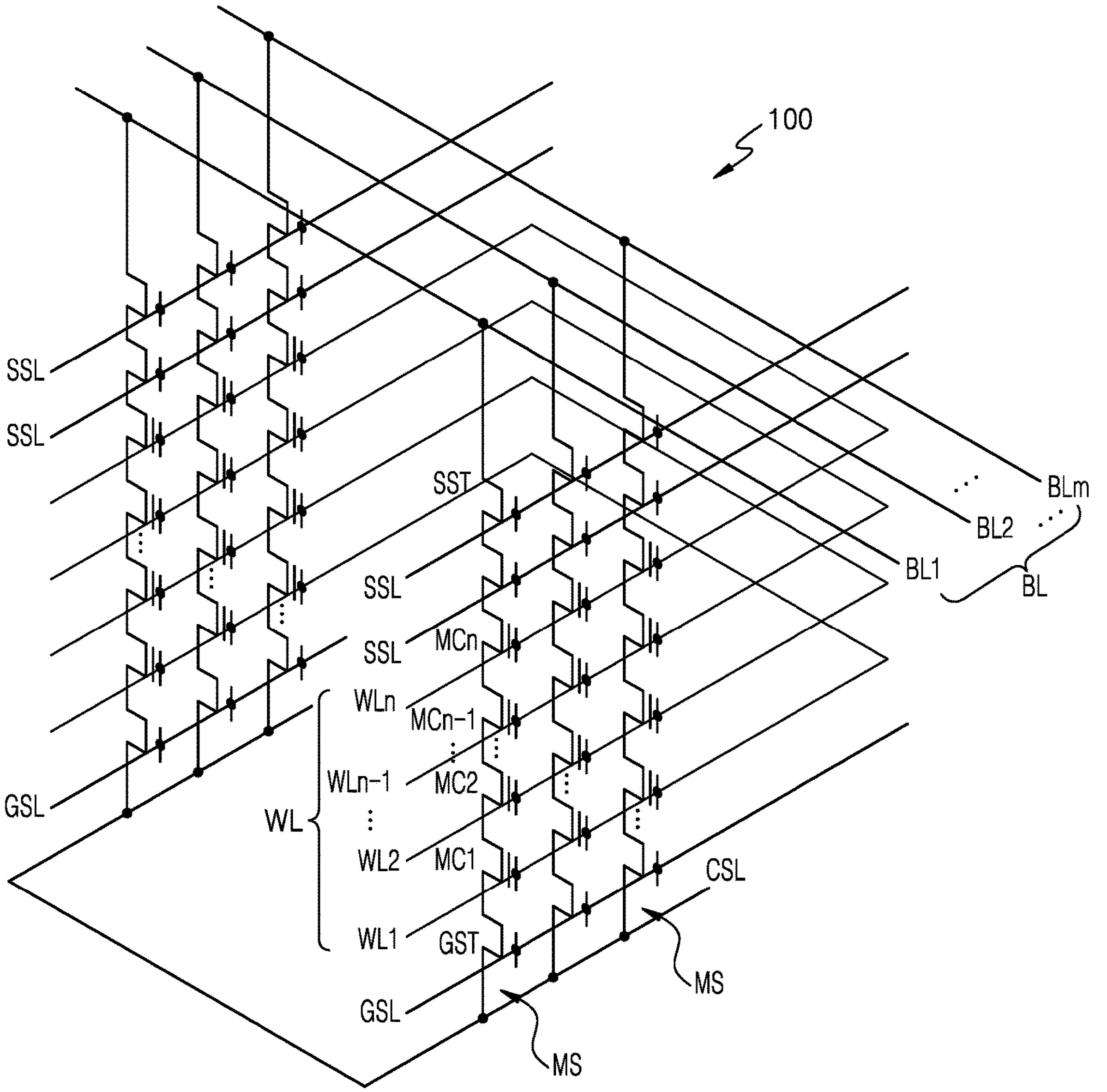
FIG. 3 is an equivalent circuit diagram of a memory cell array according to an embodiment.

FIG. 3 is an equivalent circuit diagram of a memory cell array 100 according to an embodiment. FIG. 3 illustrates an equivalent circuit diagram of a vertical NAND flash memory device having a vertical channel structure. Each of the plurality of memory blocks BLK1 to BLKz illustrated in FIG. 1 may include a memory cell array 100 illustrated in FIG. 3.

Referring to FIG. 3, the memory cell array 100 may include a plurality of memory stacks MS. The memory cell array 100 may include a plurality of bit lines BL: BL1 to BLm (m is a positive integer), a plurality of word lines WL: WL1 to WLn (n is a positive integer), at least one string select line SSL, at least one ground select line GSL, and a common source line CSL. The plurality of memory stacks MS may be formed between the plurality of bit lines BL: BL1 to BLm and the common source line CSL.

Each of the plurality of memory stacks MS may include a string select transistor SST, a ground select transistor GST, and a plurality of memory cell transistors MC1 to MCn. A drain region of the string select transistor SST may be connected to a corresponding bit line among the plurality of bit lines BL: BL1 to BLm, and a source region of the ground select transistor GST may be connected to the common source line CSL. The common source line CSL may be a region in which source regions of a plurality of ground select transistors GST are commonly connected.

The string select transistor SST may be connected to the string select line SSL, and the ground select transistor GST may be connected to the ground select line GSL. Each of the plurality of memory cell transistors MC1 to MCn may be connected to a corresponding one of the plurality of word lines WL: WL1 to WLn.

Figure 4:
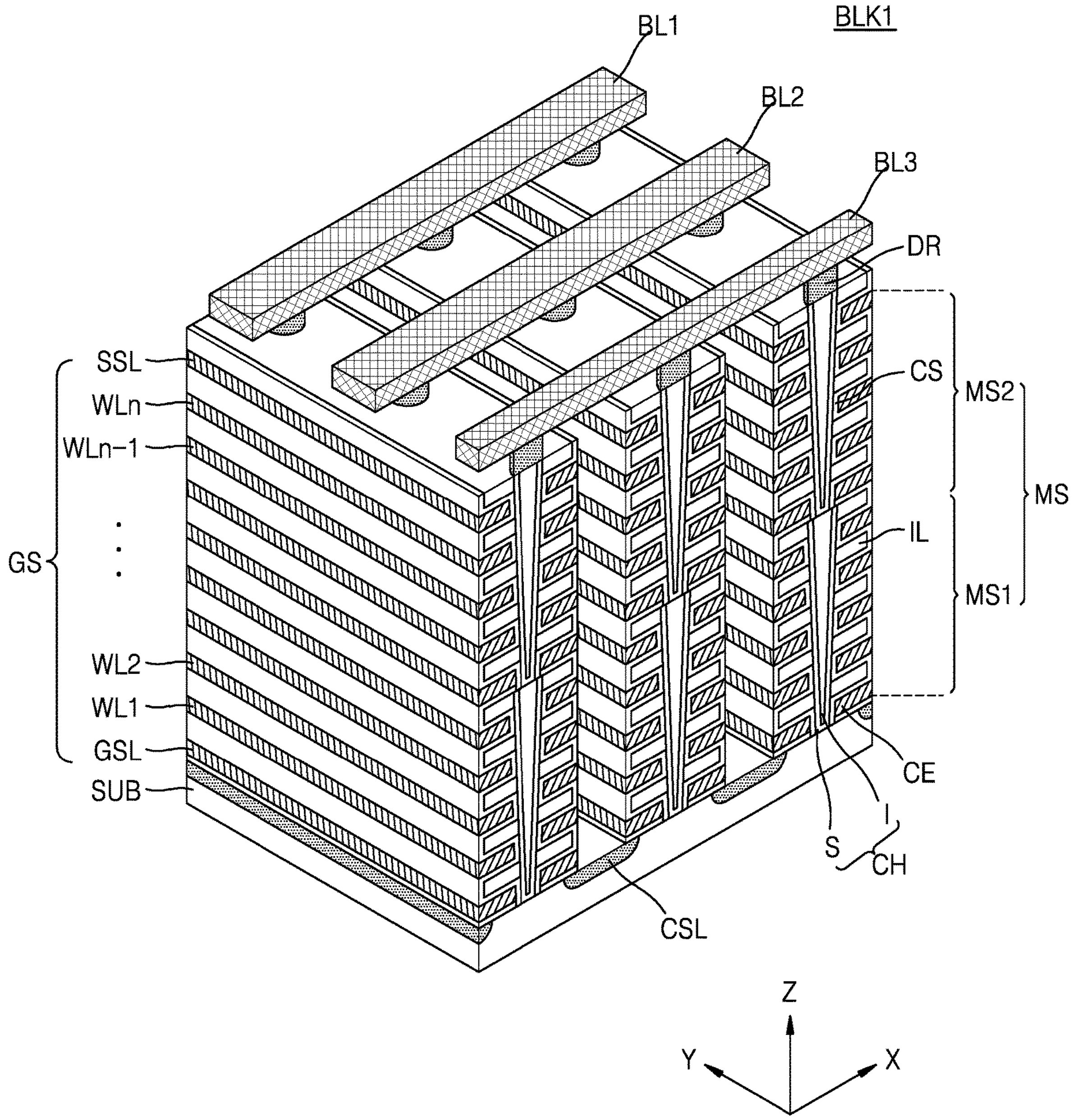
FIG. 4 is a perspective view illustrating a memory block according to an embodiment.

FIG. 4 is a perspective view illustrating a memory block BLK1 according to an embodiment. FIG. 4 shows a memory block BLK1 among the plurality of memory blocks BLK1 to BLKz of FIG. 1. The memory block BLK1 includes memory stacks MS formed in a three-dimensional structure or a vertical structure. The memory block BLK1 includes structures extending in a plurality of directions (i.e., X-axis, Y-axis, and Z-axis directions).

Referring to FIG. 4, the memory block BLK1 is formed in a vertical direction (the Z-axis direction) with respect to a substrate SUB in the cell area CA. The substrate SUB may have a first conductivity type (e.g., a p-type), and a common source line CSL doped with impurities of a second conductivity type (e.g., an n-type) may be formed in the substrate SUB.

On a region of the substrate SUB between common source lines CSL, a plurality of insulating layers IL extending in a second horizontal direction (the Y-axis direction) may be sequentially arranged in the vertical direction (the Z-axis direction). For example, the plurality of insulating layers IL may be formed to be spaced apart from each other by a certain distance in a first horizontal direction (the X direction). For example, the plurality of insulating layers IL may include an insulating material, such as silicon oxide.

Channel structures CH, which are sequentially disposed in the second horizontal direction (the Y-axis direction) and pass through the insulating layers IL in the vertical direction (the Z-axis direction), are formed on the substrate SUB between the common source lines CSL. For example, the channel structures CH may pass through the insulating layers IL and be connected to the substrate SUB. For example, each of the channel structures CH may include a plurality of materials. A surface layer S of the channel structure CH may include a silicon material having the first conductivity type and may function as a channel region. In an embodiment, the channel structure CH may be referred to as a vertical channel structure (e.g., the vertical channel structure VCS of FIG. 7) or a pillar. An inner layer I of each channel structure CH may include an insulating material, such as silicon oxide, or an air gap.

A charge storage layer CS is provided along exposed surfaces of the insulating layer IL, the channel structure CH, and the substrate SUB. The charge storage layer CS may include a gate insulating layer (referred to as a 'tunneling insulating layer'), a charge trapping layer, and a blocking insulating layer. For example, the charge storage layer CS may have an oxide-nitride-oxide (ONO) structure. In addition, a gate stack, such as a ground select line GSL, a string select line SSL, and word lines WL, is provided on the exposed surface of the charge storage layer CS.

Drain contacts or drains DR are provided on the plurality of channel structures CH, respectively. For example, the drains DR may include a silicon material doped with impurities having the second conductivity type. Bit lines BL1 to BL3, which extend in the first horizontal direction (the X-axis direction) and are spaced apart from each other by a certain distance in the second horizontal direction (the Y-axis direction), are provided on the drains DR.

The memory block BLK1 may include memory stacks MS: MS1 and MS2 stacked in the vertical direction (the Z-axis direction). In some embodiments, the memory block BLK1 may have a multi-stack memory block structure including three or more memory stacks MS. In the multi-stack memory block structure, memory stacks MS in which gate lines corresponding to the word lines WL are formed may be stacked.

Figure 5:
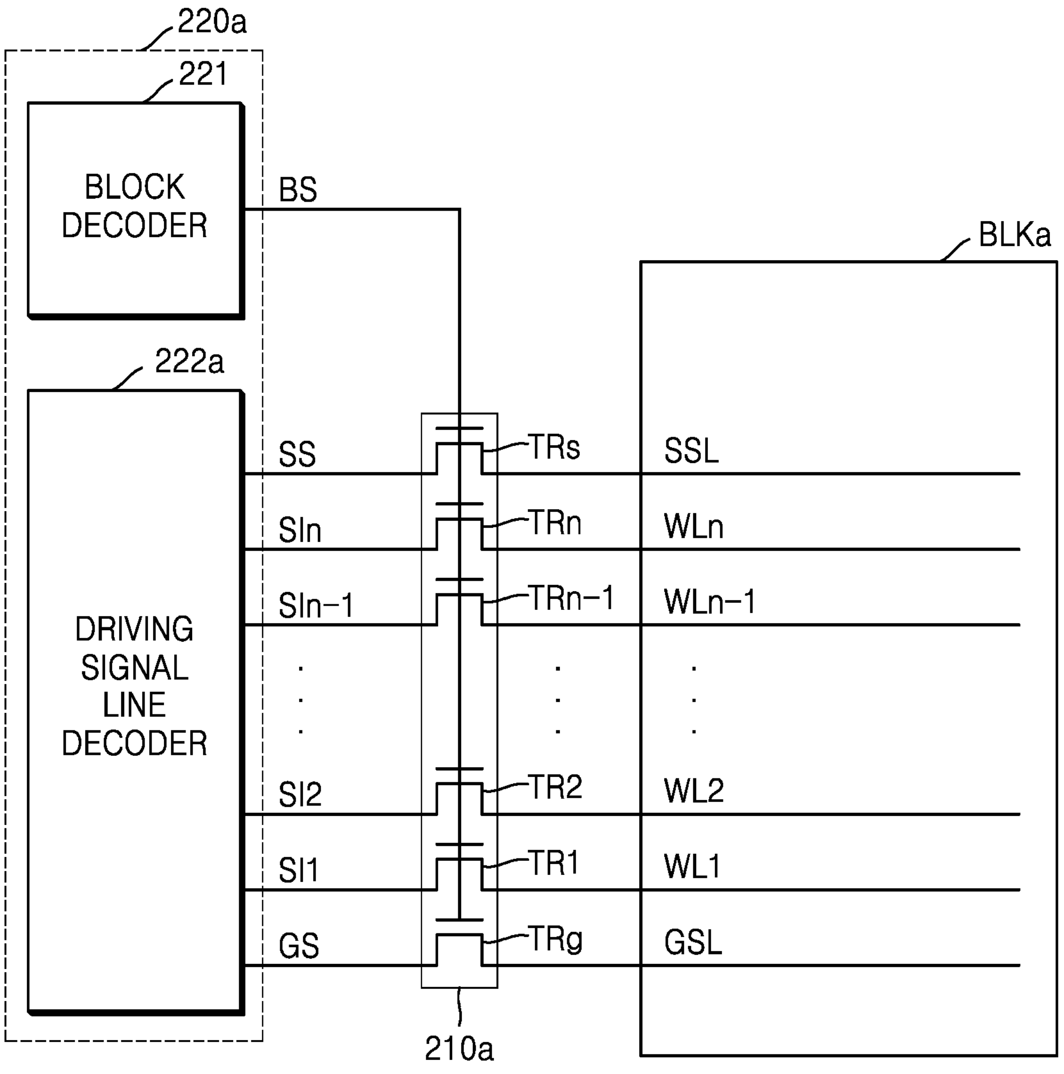
FIG. 5 is a block diagram illustrating a row decoder, a pass transistor circuit, and a memory block according to an embodiment.
Figure 6:
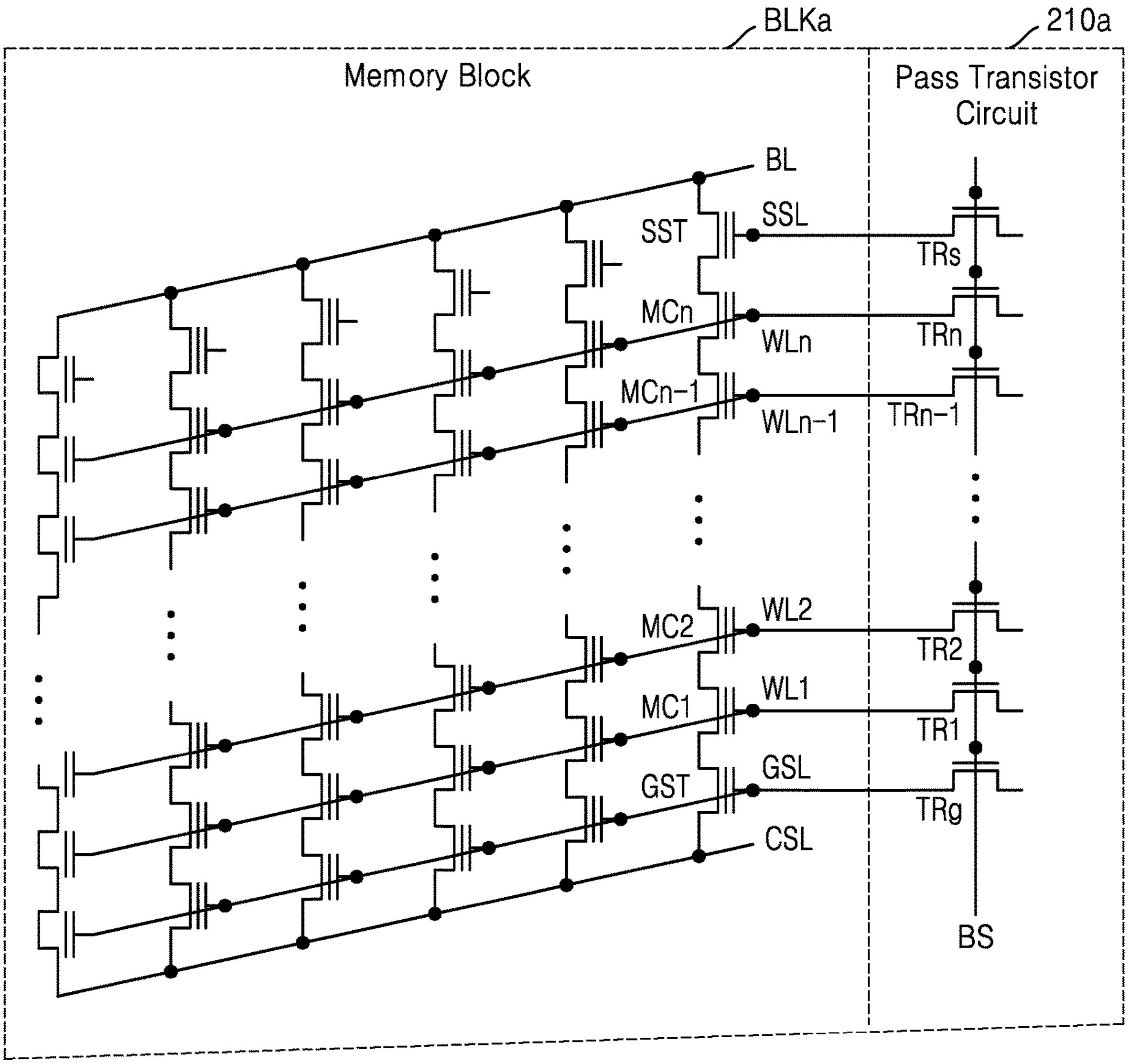
FIG. 6 is a circuit diagram illustrating a pass transistor circuit and a memory block according to an embodiment.

FIG. 5 is a block diagram illustrating a row decoder 220*a*, a pass transistor circuit 210*a*, and a memory block BLKa according to an embodiment. FIG. 6 is a circuit diagram illustrating a pass transistor circuit 210*a* and a memory block BLKa according to an embodiment.

Referring to FIGS. 5 and 6, the memory block BLKa may correspond to one of the memory blocks BLK1 to BLKz of FIG. 1. The row decoder 220*a* may correspond to an embodiment of the row decoder 220 of FIG. 1, and the pass transistor circuit 210*a* may correspond to an embodiment of the pass transistor circuit 210 of FIG. 1. Accordingly, the descriptions given above with reference to FIGS. 1 to 4 may apply to the present embodiment.

The row decoder 220*a* may include a block decoder 221 and a driving signal line decoder 222*a*. The pass transistor circuit 210*a* may include a plurality of pass transistors TRs, TR1 to TRn, and TRg, and n may be a positive integer. The pass transistor circuit 210*a* may be provided for each of the memory blocks (i.e., the memory blocks BLK1 to BLKz of FIG. 1), and the block decoder 221 and the driving signal line decoder 222*a* may be provided in common to the memory blocks (i.e., the memory blocks BLK1 to BLKz of FIG. 1).

The block decoder 221 may be connected to the pass transistor circuit 210*a* through a block select signal line BS. Specifically, the block select signal line BS may be connected to gates of the plurality of pass transistors TRs, TR1 to TRn, and TRg. For example, when a block select signal provided through the block select signal line BS is activated, the plurality of pass transistors TRs, TR1 to TRn, and TRg may be turned on, and accordingly, the memory block BLKa may be selected.

The driving signal line decoder 222*a* may be connected to the pass transistor circuit 210*a* through a string select line driving signal line SS, word line driving signal lines SI1 to SIn, and a ground select line driving signal line GS. Specifically, the string select line driving signal line SS, the word line driving signal lines SI1 to SIn, and the ground select line driving signal line GS may be respectively connected to sources of the plurality of pass transistors TRs, TR1 to TRn, and TRg.

The memory block BLKa may include a string select transistor SST, a ground select transistor GST, and a plurality of memory cell transistors MC1 to MCn, which are connected between a bit line BL and a common source line CSL. Each of the plurality of memory cell transistors MC1 to MCn may be connected to a corresponding word line among a plurality of word lines WL1 to WLn. For example, a first memory cell transistor MC1 may be connected to a first word line WL1, a second memory cell transistor MC2 may be connected to a second word line WL2, an (n−1)th memory cell transistor MCn−1 may be connected to an (n−1)th word line WLn−1, and an nth memory cell transistor MCn may be connected to an nth word line WLn. The string select transistor SST may be connected to a string select line SSL, and the ground select transistor GST may be connected to a ground select line GSL.

The pass transistor circuit 210*a* may be connected to the memory block BLKa through the ground select line GSL, the plurality of word lines WL1 to WLn, and the string select line SSL. The pass transistors TR1 to TRn may connect the word lines WL1 to WLn to the word line driving signal lines SI1 to SIn, respectively. The pass transistor TRs may connect the string select line SSL to the string select line driving signal line SS. The pass transistor TRg may connect the ground select line GSL to the ground select line driving signal line GS. For example, when the block select signal is activated, the pass transistors TRs, TR1 to TRn, and TRg may provide driving signals provided through the string select line driving signal line SS, the word line driving signal lines SI1 to SIn, and the ground select line driving signal line GS to the string select line SSL, the word lines WL1 to WLn, and the ground select line GSL, respectively.

At least some of the plurality of pass transistors TRs, TR1 to TRn, and TRg may be implemented as vertical pass transistors. For example, the pass transistors TR1 to TRn and TRg may be disposed in a stair area (e.g., the stair area SA of FIG. 2) of the word lines WL1 to WLn. In an embodiment, some of the plurality of pass transistors TRs, TR1 to TRn, and TRg may be implemented as normal pass transistors. For example, the pass transistor TRs may be disposed in the second semiconductor layer 400 of FIG. 2. This will be described in greater detail with reference to FIG. 7.

Figure 7:
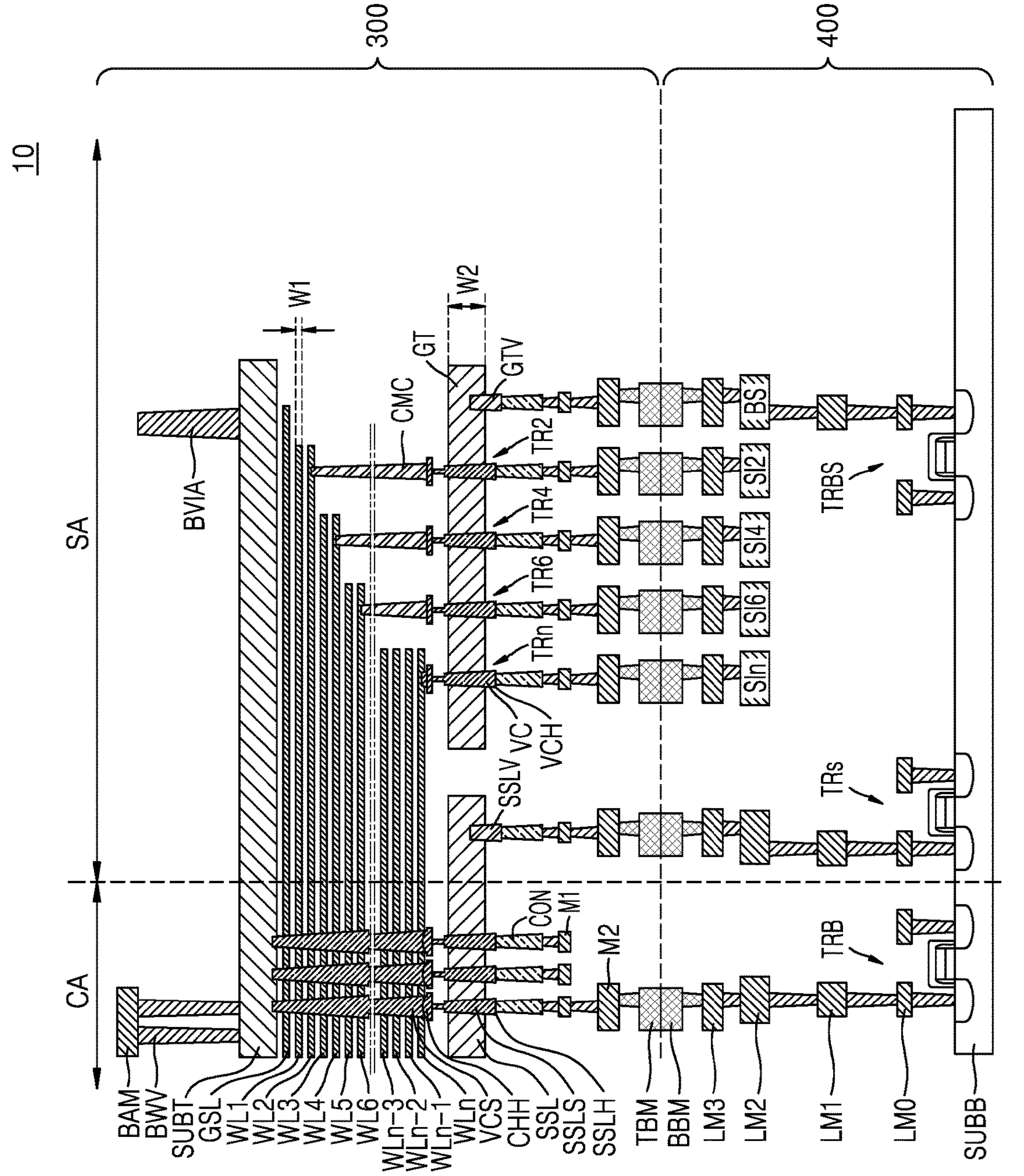
FIG. 7 is a view illustrating the structure of a memory device according to an embodiment.

FIG. 7 is a view illustrating the structure of a memory device 10 according to an embodiment.

Referring to FIG. 7, the memory device 10 may have a chip to chip (C2C) structure. The C2C structure may refer to a structure in which an upper chip including a first semiconductor layer 300, which is fabricated on a first wafer, and a lower chip including a second semiconductor layer 400, which is fabricated on a second wafer different from the first wafer, are connected to each other by a bonding method. The first semiconductor layer 300 may be referred to as a cell area, and the second semiconductor layer 400 may be referred to as a peripheral circuit area. For example, the bonding method may refer to a method of electrically connecting a bonding metal TBM formed on the uppermost metal layer of the upper chip to a bonding metal BBM formed on the uppermost metal layer of the lower chip. For example, when a bonding metal includes copper (Cu), the bonding method may be a Cu—Cu bonding method, and the bonding metal may include aluminum (Al) or tungsten (W). A surface in which the bonding metal TBM of the first semiconductor layer 300 is in contact with the bonding metal BBM of the second semiconductor layer 400 may be referred to as a bonding surface or bonding interface between the first semiconductor layer 300 and the second semiconductor layer 400.

The second semiconductor layer 400 may include a substrate SUBB, a plurality of circuit elements TRB, TRs, and TRBS formed on the substrate SUBB, and a plurality of metal layers connected to each of the plurality of circuit elements TRB, TRs, and TRBS, for example, first to fourth metal layers LM0, LM1, LM2, and LM3. The first to fourth metal layers LM0, LM1, LM2, and LM3 may be connected to each other through vias.

The plurality of circuit elements TRB, TRs, and TRBS may be included in any of a page buffer circuit (e.g., the page buffer circuit 240 of FIG. 1), a pass transistor circuit (e.g., the pass transistor circuit 210 of FIG. 1), and a row decoder (e.g., the row decoder 220 of FIG. 1). For example, the second semiconductor layer 400 may include a transistor TRB connected to a bit line, a pass transistor TRs connected to a string select line SSL, and a transistor TRBS connected to a block select signal line BS. Although it is illustrated in FIG. 7 that only the pass transistor TRs connected to the string select line SSL is disposed in the second semiconductor layer 400, the inventive concept is not limited thereto. Some of the pass transistors connected to the plurality of word lines WL1 to WLn may also be disposed in the second semiconductor layer 400.

In an embodiment, the first to third metal layers LM0 to LM2 may include tungsten having a relatively high electrical resistivity, and the fourth metal layer LM3 may include copper having a relatively low electrical resistivity. In the present specification, four metal layers, e.g., the first to fourth metal layers LM0, LM1, LM2, and LM3, are illustrated and described, but the number of metal layers may be variously modified, and the constituent material of each metal layer may also be variously modified.

The second semiconductor layer 400 may further include an interlayer insulating layer disposed on the substrate SUBB to cover the plurality of circuit elements TRB, TRs, and TRBS and the first to fourth metal layers LM0, LM1, LM2, and LM3. The interlayer insulating layer may include an insulating material, such as silicon oxide or silicon nitride.

The second semiconductor layer 400 may include the bonding metal BBM. The bonding metal BBM may be electrically connected to the bonding metal TBM of the first semiconductor layer 300 by a bonding method, and the bonding metal BBM may include aluminum, copper, tungsten, or the like.

The first semiconductor layer 300 may provide a plurality of memory blocks. The first semiconductor layer 300 may include a substrate SUBT and a common source line. The plurality of word lines WL1 to WLn may be stacked on the substrate SUBT in a direction perpendicular to one surface of the substrate SUBT. The string select line SSL may be disposed below the plurality of word lines WL1 to WLn, and the ground select line GSL may be disposed above the plurality of word lines WL1 to WLn in the depicted orientation. The plurality of word lines WL1 to WLn may be disposed between the string select line SSL and the ground select line GSL. In other words, the string select line SSL may be disposed between the plurality of word lines WL1 to WLn and the bonding surface between the first semiconductor layer 300 and the second semiconductor layer 400. Also, the ground select line GSL may be disposed between the plurality of word lines WL1 to WLn and the substrate SUBT.

For example, the plurality of word lines WL1 to WLn, the string select line SSL, and the ground select line GSL may each include a metal, such as tungsten, nickel, cobalt, or tantalum, a metal silicide, such as tungsten silicide, nickel silicide, cobalt silicide, or tantalum silicide, polysilicon doped with impurities, or a combination thereof.

In a cell area CA, a plurality of vertical channel structures VCS may extend in a direction (i.e., a vertical direction) perpendicular to one surface of the substrate SUBT and pass through the plurality of word lines WL1 to WLn and the ground select line GSL. The plurality of vertical channel structures VCS may be formed inside a channel hole CHH passing through the plurality of word lines WL1 to WLn and the ground select line GSL in the vertical direction. The plurality of vertical channel structures VCS may include a data storage layer, a channel layer, and a buried insulating layer.

A plurality of string select transistor structures SSLS passing through the string select line SSL may be formed in the cell area CA. The plurality of string select transistor structures SSLS may be respectively formed inside a plurality of string select line holes SSLH passing through the string select line SSL in the vertical direction. The plurality of string select transistor structures SSLS may have the same configuration as the plurality of vertical channel structures VCS. The plurality of string select transistor structures SSLS and the plurality of vertical channel structures VCS may be separated from each other and may be electrically connected to each other through a plurality of pads.

Channel layers of the plurality of string select transistor structures SSLS and the plurality of vertical channel structures VCS may be electrically connected to a first metal layer M1 and a second metal layer M2. For example, a bit line contact may be formed in the first metal layer M1, and a bit line may be formed in the second metal layer M2. The plurality of string select transistor structures SSLS may be electrically connected to the first metal layer M1 through a contact CON. In FIG. 7, only two metal layers, that is, the first metal layer M1 and the second metal layer M2, are shown in the first semiconductor layer 300. However, the inventive concept is not limited thereto, and the number of metal layers may be variously modified.

The cell area CA in which the plurality of vertical channel structures VCS, the plurality of string select transistor structures SSLS, the bit line, or the like are disposed may be referred to as a bit line bonding area. The bit line may be electrically connected to the transistor TRB included in the page buffer circuit 240 of the second semiconductor layer 400 in the cell area CA.

A via SSLV may be formed to apply a voltage to the string select line SSL. The string select line SSL may be electrically connected to the pass transistor TRs included in the pass transistor circuit 210 of the second semiconductor layer 400 through the via SSLV, the contact CON, the plurality of metal layers M1 and M2, and the bonding metal TBM of the first semiconductor layer 300 and through the bonding metal BBM and the plurality of metal layers LM0 to LM3 of the second semiconductor layer 400.

In the stair area SA, the plurality of word lines WL1 to WLn may be parallel to one surface of the substrate SUBT and extend in a direction perpendicular to an extension direction of the bit line. The plurality of word lines WL1 to WLn may be respectively connected to a plurality of cell contact plugs CMC. The plurality of word lines WL1 to WLn and the plurality of cell contact plugs CMC may be connected to each other through pads provided by extending at least some of the plurality of word lines WL1 to WLn to have different lengths.

A plurality of pass transistors TR2, TR4, TR6, and TRn may be formed in the stair area SA. Vertical channels VC respectively included in the plurality of pass transistors TR2, TR4, TR6, and TRn may be commonly connected to a gate GT.

The gate GT may be formed from the same layer as the string select line SSL. In an embodiment, the gate GT may be formed through the same process as the string select line SSL, and the string select line SSL and the gate GT may include the same material as the plurality of word lines WL1 to WLn. For example, in the cell area CA and the stair area SA, a mold (i.e., a self-aligned mold) extending to the stair area SA may be formed on a certain layer of the first semiconductor layer 300 to form the string select line SSL and the gate GT. Thereafter, the string select line SSL and the gate GT may be formed by replacing the mold with a conductive material, such as polysilicon or metal. As such, the string select line SSL and the gate GT may be respective (e.g., separate) portions of a same layer.

The plurality of cell contact plugs CMC may be connected to the plurality of pass transistors TR2, TR4, TR6, and TRn. The plurality of cell contact plugs CMC may be electrically connected to a plurality of vertical channels VC extending through the gate GT in the vertical direction. The plurality of vertical channels VC may be formed in a vertical hole VCH passing through the gate GT.

The plurality of vertical channels VC may be manufactured in the same process as the plurality of string select transistor structures SSLS. In an embodiment, the width of the plurality of vertical channels VC in a horizontal direction may be equal to the width of the plurality of string select transistor structures SSLS in the horizontal direction. Alternatively, in an embodiment, the width of the plurality of vertical channels VC in the horizontal direction may be different from the width of the plurality of string select transistor structures SSLS in the horizontal direction. For example, the width of the plurality of vertical channels VC may be greater or less than the width of the plurality of string select transistor structures SSLS.

A via GTV may be formed to apply a voltage to the gate GT. The gate GT may be electrically connected to the transistor TRBS included in the row decoder 230 of the second semiconductor layer 400 through the via GTV, the contact CON, the plurality of metal layers M1 and M2, and the bonding metal TBM of the first semiconductor layer 300 and through the bonding metal BBM and the plurality of metal layers LM0 to LM3 of the second semiconductor layer 400.

The plurality of pass transistors TR2, TR4, TR6, and TRn may be respectively connected to a plurality of word line driving signal lines SI2, SI4, SI6, and SIn disposed in the first semiconductor layer 300 or the second semiconductor layer 400. In an embodiment, the plurality of word line driving signal lines SI2, SI4, SI6, and SIn may be disposed in a metal layer (e.g., the metal layer LM2) of the second semiconductor layer 400. Also, in an embodiment, the plurality of word line driving signal lines SI2, SI4, SI6, and SIn may be formed to vertically overlap the plurality of pass transistors TR2, TR4, TR6, and TRn. Accordingly, a wiring area required to form the plurality of word line driving signal lines SI2, SI4, SI6, and SIn may be reduced.

For example, the word line driving signal line SI2 may be connected to the pass transistor TR2 of the first semiconductor layer 300 through the contact CON, the metal layers M1 and M2, and the bonding metal TBM, which are included in the first semiconductor layer 300, and the bonding metal BBM and the metal layer LM3 of the second semiconductor layer 400. Although not shown in FIG. 7, at least some of pass transistors (e.g., the pass transistors TRg, TR1, TR3, TR5, and TR7 to TRn−1 of FIG. 5) other than the pass transistors TR2, TR4, TR6, and TRn may be disposed as vertical transistors in the stair area SA of the first semiconductor layer 300 and may be commonly connected to the gate GT formed from the same layer as the string select line SSL.

In an embodiment, a width W2 of the gate GT in the vertical direction (e.g., the thickness) may be greater than the width of each of the plurality of word lines WL1 to WLn, for example, a width W1 of the first word line WL1. The gate GT may be formed in the same process as the string select line SSL, and thus, the width W2 of the gate GT may be equal to the width of the string select line SSL.

The memory device 10 according to embodiments of the disclosure may include the pass transistors TR2, TR4, TR6, and TRn each having a vertical structure, disposed in the stair area SA of the word lines WL1 to WLn. Accordingly, an area in which the pass transistors TR2, TR4, TR6, and TRn each having a vertical structure are disposed overlaps the stair area SA (i.e., in a vertical direction or in plan view), and thus, the size of the memory device 10 may be reduced. Also, because the memory device 10 includes the pass transistors TR2, TR4, TR6, and TRn each having a vertical structure on the same layer as a layer on which the string select line SSL is formed, the pass transistors TR2, TR4, TR6, and TRn may be manufactured together with the string select line SSL and the string select transistor structure SSLS in a process of manufacturing the string select line SSL and the string select transistor structure SSLS, and thus, a process cost of forming or manufacturing cost of the pass transistors TR2, TR4, TR6, and TRn may be reduced. Also, because the memory device 10 includes the pass transistors TR2, TR4, TR6, and TRn (each having a vertical structure and formed on the same layer as the layer on which the string select line SSL is formed), the string select line SSL (disposed at a lowermost position from among the plurality of word lines WL1 to WLn in the depicted orientation), the ground select line GSL, and the string select line SSL in the first semiconductor layer 300, it may be easier to form wiring lines that electrically connect the circuit element (e.g., the transistor TRBS) of the second semiconductor layer 400 to the pass transistors TR2, TR4, TR6, and TRn, and because the lengths of the wiring lines are shortened, a wiring area may be reduced.

In an embodiment, the operating voltage of the transistor TRBS forming the row decoder 230 may be different from the operating voltage of the transistor TRB forming the page buffer circuit 240. For example, the operating voltage of the transistor TRB forming the page buffer circuit 240 may be greater than the operating voltage of the transistor TRBS forming the row decoder 230.

A first input/output pad BAM may be disposed on the substrate SUBT. For example, the first input/output pad BAM may supply power to the substrate SUBT through a contact plug BWV. The contact plug BWV may be formed to pass through an upper insulating layer covering one surface of the substrate SUBT. A bypass via BVIA may be disposed on the substrate SUBT in addition to the contact plug BWV.

Although not shown in FIG. 7, a lower insulating layer covering the lower surface of the substrate SUBB may be formed under the substrate SUBB, and a second input/output pad may be formed on the lower insulating layer. According to an embodiment, the first input/output pad and the second input/output pad may be selectively formed. For example, the memory device 10 may include only the first input/output pad BAM disposed above the substrate SUBB, or may include only the second input/output pad disposed below the substrate SUBT. Alternatively, the memory device 10 may include both the first input/output pad BAM and the second input/output pad.

Figure 8:
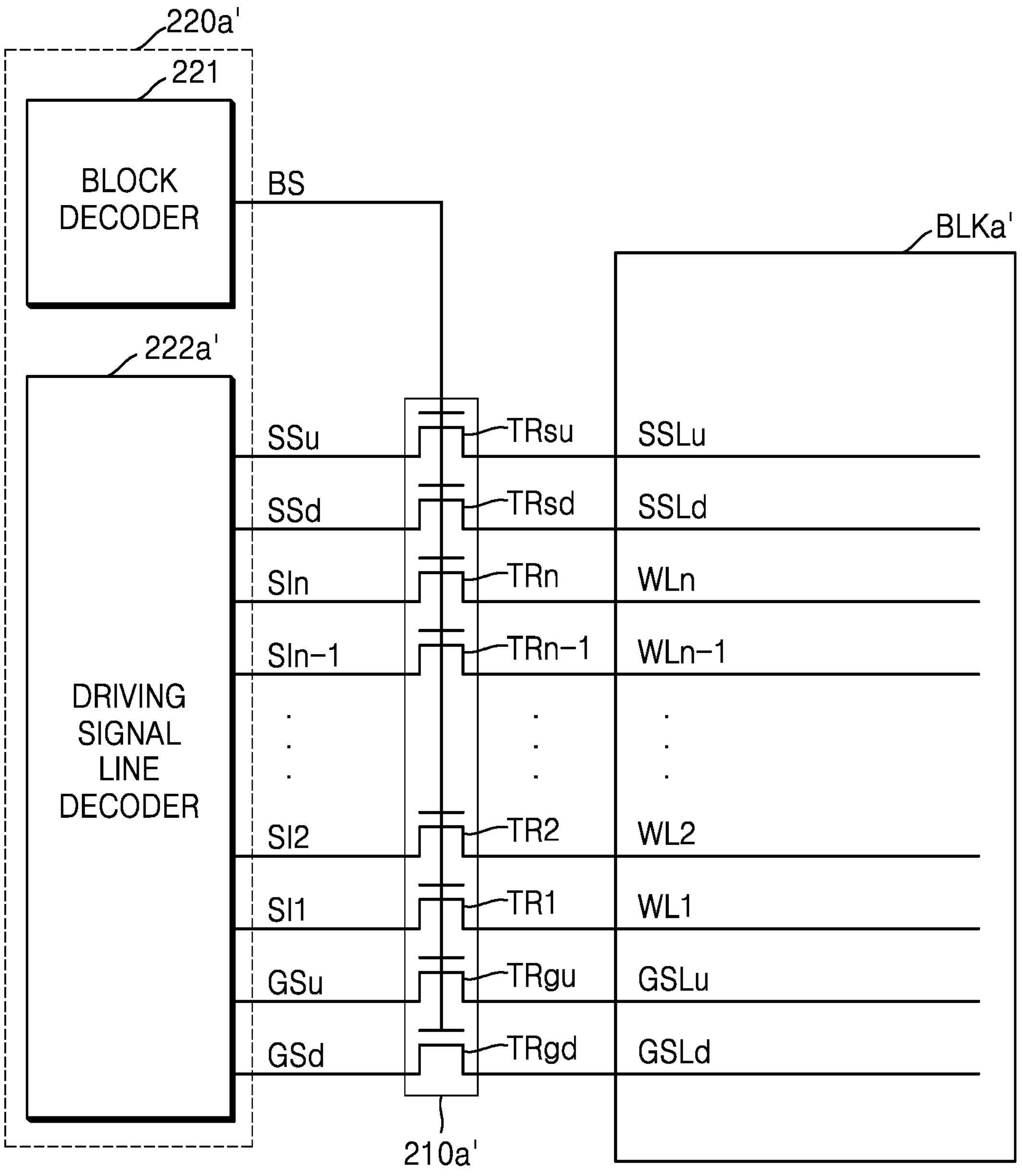
FIG. 8 is a block diagram illustrating a row decoder, a pass transistor circuit, and a memory block according to an embodiment.
Figure 9:
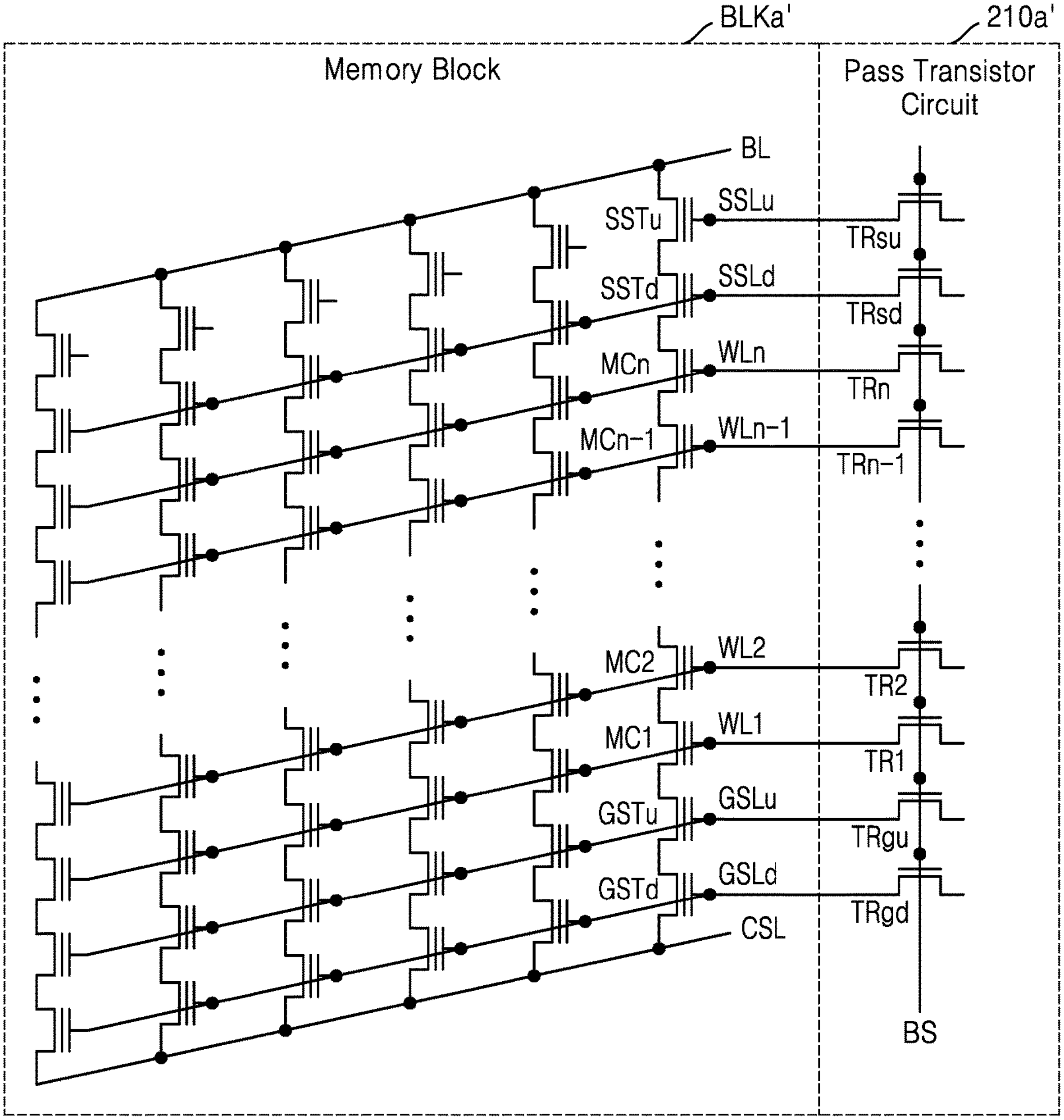
FIG. 9 is a circuit diagram illustrating a pass transistor circuit and a memory block according to an embodiment.

FIG. 8 is a block diagram illustrating a row decoder 220*a*', a pass transistor circuit 210*a*', and a memory block BLKa' according to an embodiment. FIG. 9 is a circuit diagram illustrating a pass transistor circuit 210*a*' and a memory block BLKa' according to an embodiment.

Referring to FIGS. 8 and 9, the memory block BLKa' may correspond to one of the memory blocks BLK1 to BLKz of FIG. 1. The row decoder 220*a*' may correspond to an embodiment of the row decoder 220 of FIG. 1, and the pass transistor circuit 210*a*' may correspond to an embodiment of the pass transistor circuit 210 of FIG. 1.

The row decoder 220*a*' may include a block decoder 221 and a driving signal line decoder 222*a*'. The pass transistor circuit 210*a*' may include a plurality of pass transistors TRsu, TRsd, TR1 to TRn, TRgu, and TRgd, and n may be a positive integer. The pass transistor circuit 210*a*' may be provided for each of the memory blocks (i.e., the memory blocks BLK1 to BLKz of FIG. 1), and the block decoder 221 and the driving signal line decoder 222*a*' may be provided in common in the memory blocks (i.e., the memory blocks BLK1 to BLKz of FIG. 1).

The block decoder 221 may be connected to the pass transistor circuit 210*a*' through a block select signal line BS. Specifically, the block select signal line BS may be connected to gates of the plurality of pass transistors TRsu, TRsd, TR1 to TRn, TRgu, and TRgd. For example, when a block select signal provided through the block select signal line BS is activated, the plurality of pass transistors TRsu, TRsd, TR1 to TRn, TRgu, and TRgd may be turned on, and accordingly, the memory block BLKa' may be selected.

The driving signal line decoder 222*a*' may be connected to the pass transistor circuit 210*a*' through a first string select line driving signal line SSu, a second string select line driving signal line SSd, word line driving signal lines SI1 to SIn, a first ground select line driving signal line GSu, and a second ground select line driving signal line GSd. Specifically, the first string select line driving signal line SSu, the second string select line driving signal line SSd, the word line driving signal lines SI1 to SIn, the first ground select line driving signal line GSu, and the second ground select line driving signal line GSd may be respectively connected to sources of the plurality of pass transistors TRsu, TRsd, TR1 to TRn, TRgu, and TRgd.

The memory block BLKa' may include a first string select transistor SSTu, a second string select transistor SSTd, a first ground select transistor GSTu, a second ground select transistor GSTd, and a plurality of memory cell transistors MC1 to MCn, which are connected between a bit line BL and a common source line CSL. The first string select transistor SSTu may be connected to a first string select line SSLu, the second string select transistor SSTd may be connected to a second string select line SSLd, the first ground select transistor GSTu may be connected to a first ground select line GSLu, and the second ground select transistor GSTd may be connected to a second ground select line GSLd. However, in contrast to the configuration shown FIGS. 9 and 10, the memory block BLKa' may include one of the first ground select line GSLu and the second ground select line GSLd in some embodiments.

The pass transistor circuit 210*a*' may be connected to the memory block BLKa' through the first ground select line GSLu, the second ground select line GSLd, a plurality of word lines WL1 to WLn, the first string select line SSLu, and the second string select line SSLd. The pass transistors TR1 to TRn may connect the word lines WL1 to WLn to the word line driving signal lines SI1 to SIn, respectively. The pass transistor TRsu may connect the first string select line SSLu to the first string select line driving signal line SSu, and the pass transistor TRsd may connect the second string select line SSLd to the second string select line driving signal line SSd. The pass transistor TRgu may connect the first ground select line GSLu to the first ground select line driving signal line GSu, and the pass transistor TRgd may connect the second ground select line GSLd to the second ground select line driving signal line GSd.

At least some of the plurality of pass transistors TRsu, TRsd, TR1 to TRn, TRgu, and TRgd may be implemented as vertical pass transistors. For example, the pass transistors TR1 to TRn, TRgu, and TRgd may be disposed in a stair area (e.g., the stair area SA of FIG. 2) of the word lines WL1 to WLn. In an embodiment, some of the plurality of pass transistors TRsu, TRsd, TR1 to TRn, TRgu, and TRgd may be implemented as normal pass transistors. For example, the pass transistors TRsu and TRsd may be disposed in the second semiconductor layer 400 of FIG. 2. This will be described in greater detail with reference to FIG. 10.

Figure 10:
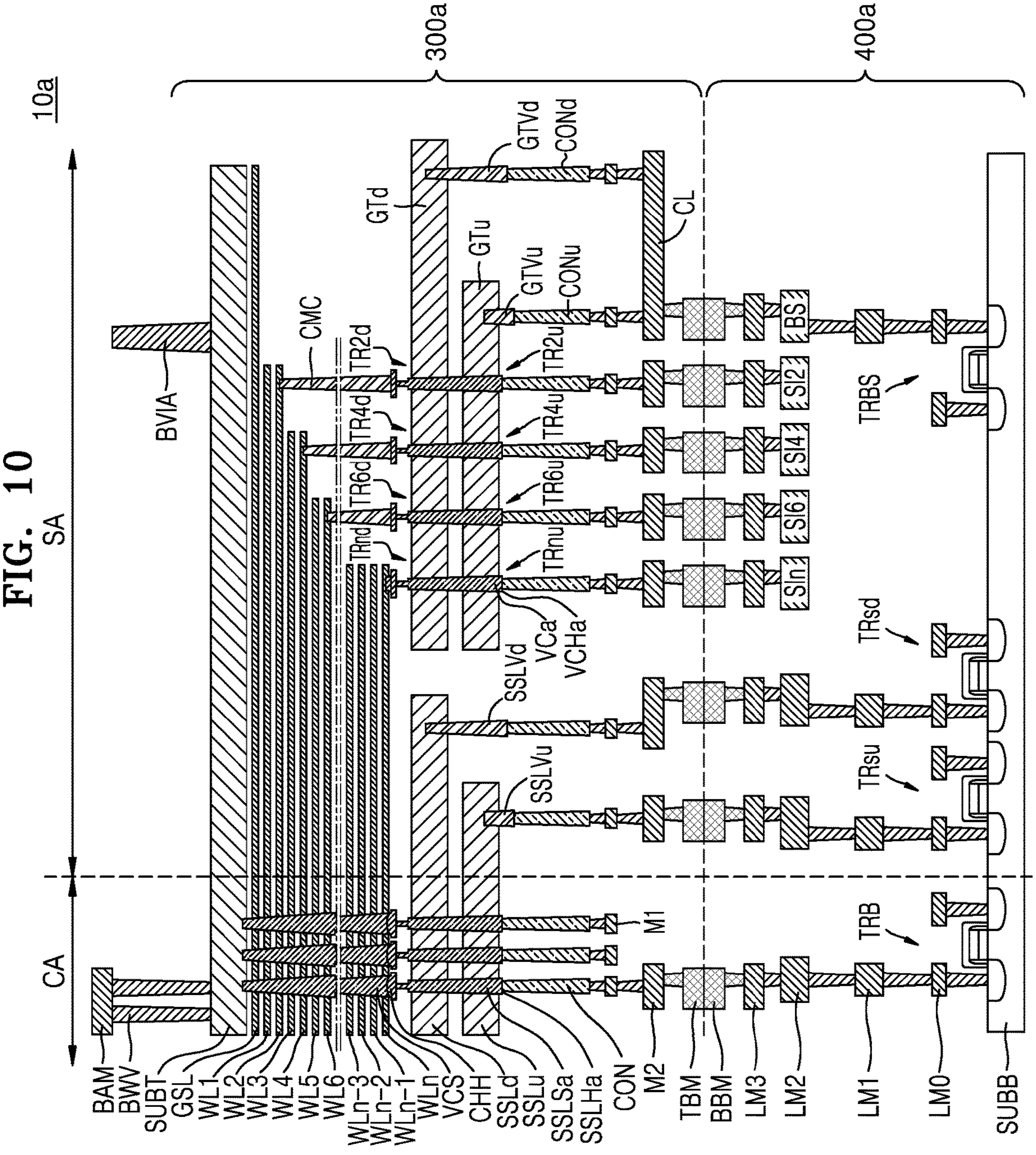
FIG. 10 is a view illustrating the structure of a memory device according to an embodiment.

FIG. 10 is a view illustrating the structure of a memory device 10*a* according to an embodiment. With respect to FIG. 10, redundant descriptions of the same reference numerals as in FIG. 7 are omitted.

Referring to FIG. 10, the memory device 10*a* may include a first semiconductor layer 300*a* and a second semiconductor layer 400*a* disposed under the first semiconductor layer 300*a*. The first semiconductor layer 300*a* and the second semiconductor layer 400*a* may have a C2C structure, the first semiconductor layer 300*a* may be referred to as a cell area, and the second semiconductor layer 400*a* may be referred to as a peripheral circuit area.

The second semiconductor layer 400*a* may include a plurality of circuit elements TRB, TRsu, TRsd, and TRBS formed on the substrate SUBB. The plurality of circuit elements TRB, TRsu, TRsd, and TRBS may be included in a page buffer circuit (e.g., the page buffer circuit 240 of FIG. 1), a pass transistor circuit (e.g., the pass transistor circuit 210 of FIG. 1), and a row decoder (e.g., the row decoder 220 of FIG. 1). For example, the second semiconductor layer 400*a* may include a transistor TRB connected to a bit line, a pass transistor TRsu connected to a first string select line SSLu, a pass transistor TRsd connected to a second string select line SSLd, and a transistor TRBS connected to a block select signal line BS.

The first semiconductor layer 300*a* may include a plurality of word lines WL1 to WLn stacked in a direction perpendicular to one surface of the substrate SUBT. The first string select line SSLu and the second string select line SSLd may be disposed below the plurality of word lines WL1 to WLn, and the ground select line GSL may be disposed above the plurality of word lines WL1 to WLn in the depicted orientation. In other words, the first string select line SSLu and the second string select line SSLd may be disposed between the plurality of word lines WL1 to WLn and the bonding surface between the first semiconductor layer 300*a* and the second semiconductor layer 400*a*.

In contrast to the configuration shown in FIG. 10, the ground select line GSL may include a plurality of ground select lines that are stacked in some embodiments. For example, the first ground select line GSLu and the second ground select line GSLd of FIG. 8 may be disposed between the plurality of word lines WL1 to WLn and the substrate SUBT.

A plurality of string select transistor structures SSLSa passing through the first string select line SSLu and the second string select line SSLd may be formed in a cell area CA. The plurality of string select transistor structures SSLSa may be formed inside a plurality of string select line holes SSLHa passing through the string select line SSL (e.g., SSLu, SSLd) in a vertical direction. The plurality of string select transistor structures SSLSa and a plurality of vertical channel structures VCS may be formed through separate processes, may be physically separated from each other, and may be electrically connected to each other through a plurality of pads.

A first via SSLVu may be formed to apply a voltage to the first string select line SSLu. The first string select line SSLu may be electrically connected to the pass transistor TRsu included in the pass transistor circuit 210 of the second semiconductor layer 400*a* through the first via SSLVu, a contact CON, a plurality of metal layers M1 and M2, and a bonding metal TBM of the first semiconductor layer 300*a* and through a bonding metal BBM and a plurality of metal layers LM0 to LM3 of the second semiconductor layer 400*a*.

A second via SSLVd may be formed to apply a voltage to the second string select line SSLd. The second string select line SSLd may be electrically connected to the pass transistor TRsd included in the pass transistor circuit 210 of the second semiconductor layer 400*a* through the second via SSLVd, the contact CON, the plurality of metal layers M1 and M2, and the bonding metal TBM of the first semiconductor layer 300*a* and through the bonding metal BBM and the plurality of metal layers LM0 to LM3 of the second semiconductor layer 400*a*.

A plurality of pass transistors TR2*u*, TR2*d*, TR4*u*, TR4*d*, TR6*u*, TR6*d*, TRnu, and TRnd may be formed in the stair area SA. Vertical channels VCa respectively included in the plurality of pass transistors TR2*u*, TR4*u*, TR6*u*, and TRnu may be commonly connected to a first gate GTu, and vertical channels VCa respectively included in the plurality of pass transistors TR2*d*, TR4*d*, TR6*d*, and TRnd may be commonly connected to a second gate GTd. Pass transistors formed in the same vertical channel may be connected to the same word line. In an embodiment, the first gate GTu and the second gate GTd may be formed on the same layer as the first string select line SSLu and the second string select line SSLd, respectively. That is, the string select line SSLu and the gate GTu may be respective portions of a same first layer, while the string select line SSLd and the gate GTd may be respective portions of a same second layer.

In an embodiment, the width of each of the first gate GTu and the second gate GTd in the vertical direction (e.g., the thickness) may be greater than the width of each of the plurality of word lines WL1 to WLn. The first gate GTu and the second gate GTd may be formed in the same process as the first string select line SSLu and the second string select line SSLd, respectively, and thus, the width of the first gate GTu and the width of the second gates GTd may be equal to the width of the first string select line SSLu and the width of the second string select line SSLd, respectively.

The plurality of cell contact plugs CMC may be connected to the plurality of pass transistors TR2*u*, TR2*d*, TR4*u*, TR4*d*, TR6*u*, TR6*d*, TRnu, and TRnd. The plurality of cell contact plugs CMC may be electrically connected to a plurality of vertical channels VCa extending through the first gate GTu and the second gate GTd in the vertical direction. The plurality of vertical channels VCa may be formed in a vertical hole VCHa passing through the first gate GTu and the second gate GTd.

In an embodiment, the width of the plurality of vertical channels VCa in a horizontal direction may be equal to the width of the plurality of string select transistor structures SSLSa in the horizontal direction. Alternatively, in an embodiment, the width of the plurality of vertical channels VCa in the horizontal direction may be different from the width of the plurality of string select transistor structures SSLSa in the horizontal direction. For example, the width of the plurality of vertical channels VCa may be greater than or less than the width of the plurality of string select transistor structures SSLSa.

A first via GTVu may be formed to apply a voltage to the first gate GTu. The first gate GTu may be electrically connected to the transistor TRBS included in the row decoder 230 of the second semiconductor layer 400*a* through the first via GTVu, a first contact CONu, the plurality of metal layers M1 and M2, and the bonding metal TBM of the first semiconductor layer 300*a* and through the bonding metal BBM and the plurality of metal layers LM0 to LM3 of the second semiconductor layer 400*a*.

A second via GTVd may be formed to apply a voltage to the second gate GTd. The second gate GTd may be electrically connected to the transistor TRBS included in the row decoder 230 of the second semiconductor layer 400*a* through the second via GTVd, a second contact CONd, the plurality of metal layers M1 and M2, and the bonding metal TBM of the first semiconductor layer 300*a* and through the bonding metal BBM and the plurality of metal layers LM0 to LM3 of the second semiconductor layer 400*a*.

The first gate GTu and the second gate GTd may be electrically connected to each other through a connection line CL. For example, although the connection line CL may be formed in the metal layer M1 of the first semiconductor layer 300*a*, the inventive concept is not limited thereto. The connection line CL may be formed in another metal layer (e.g., the second metal layer M2) of the first semiconductor layer 300*a*, or may be formed in the plurality of metal layers LM0, LM1, LM2, and LM3 of the second semiconductor layer 400*a*.

The plurality of pass transistors TR2*u*, TR2*d*, TR4*u*, TR4*d*, TR6*u*, TR6*d*, TRnu, and TRnd may be connected to a plurality of word line driving signal lines S12, S14, S16, and SIn disposed in the first semiconductor layer 300*a* or the second semiconductor layer 400*a*. For example, the plurality of word line driving signal lines SI2, SI4, SI6, and SIn may be disposed in the second semiconductor layer 400*a* and may overlap the plurality of pass transistors TR2*u*, TR2*d*, TR4*u*, TR4*d*, TR6*u*, TR6*d*, TRnu, and TRnd in the vertical direction.

Figure 11:
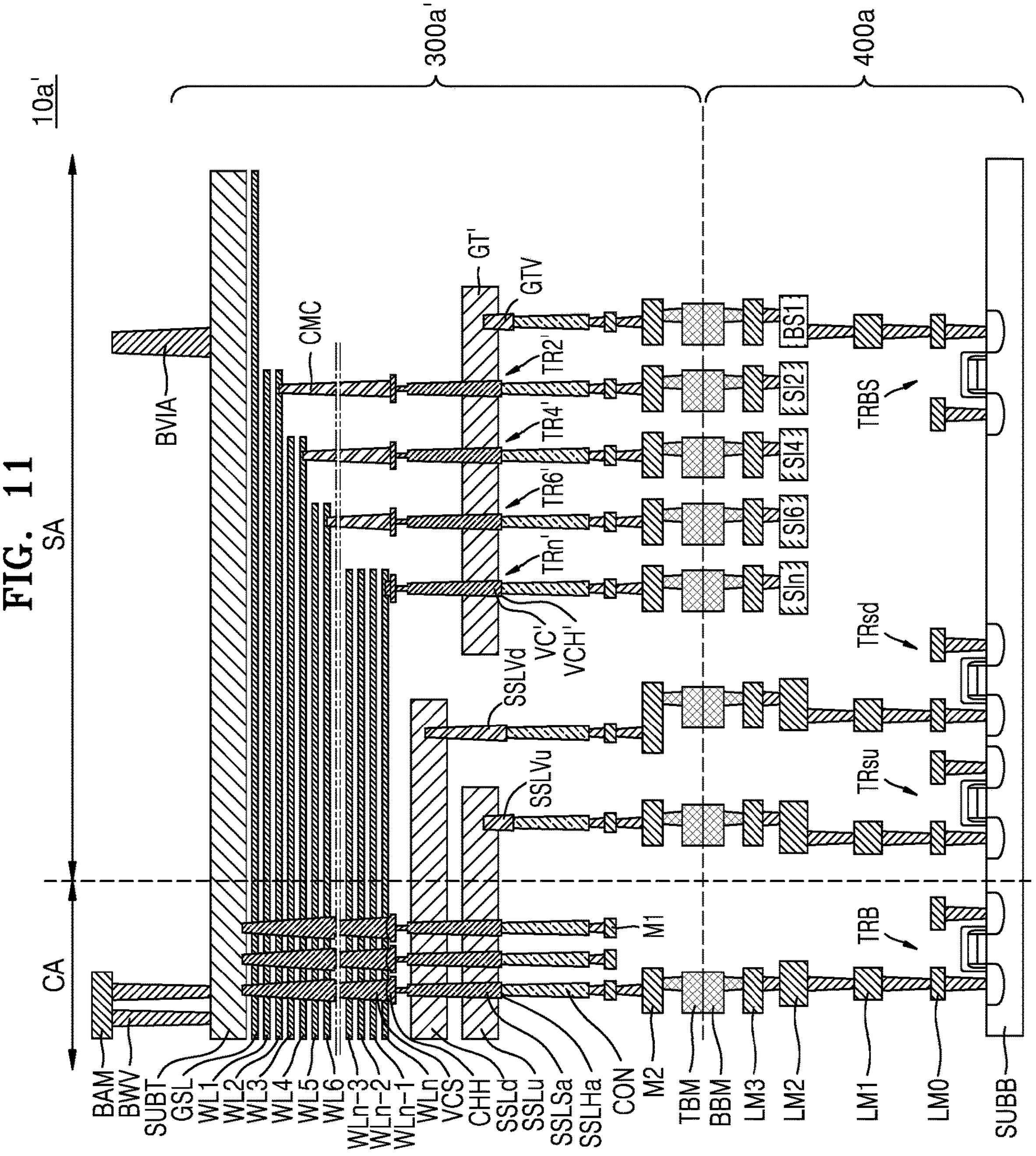
FIG. 11 is a view illustrating the structure of a memory device according to an embodiment.

FIG. 11 is a view illustrating the structure of a memory device 10*a*' according to an embodiment. With respect to FIG. 11, redundant descriptions of the same reference numerals as in FIGS. 7 and 10 are omitted.

Referring to FIG. 11, the memory device 10*a*' may include a first semiconductor layer 300*a*' and a second semiconductor layer 400*a* disposed under the first semiconductor layer 300*a'*.

A plurality of pass transistors TR2', TR4', TR6', and TRn' may be formed in a stair area SA of the first semiconductor layer 300*a*'. A plurality of vertical channels VC' respectively included in the plurality of pass transistors TR2', TR4', TR6', and TRn' may be commonly connected to a gate GT'. The plurality of vertical channels VC' may be formed in a vertical hole VCH' passing through the first gate GT'. The plurality of pass transistors TR2', TR4', TR6', and TRn' may be connected to a plurality of word line driving signal lines S12, S14, S16, and SIn, respectively.

In an embodiment, the gate GT' may be formed on the same layer as one of a first string select line SSLu and a second string select line SSLd. For example, the gate GT' may be formed on the same layer as the first string select line SSLu disposed close to the second semiconductor layer 400*a* from among the first string select line SSLu and the second string select line SSLd, and the width of the gate GT' in a vertical direction may be equal to the width of the first string select line SSLu in the vertical direction. That is, the gate GT' and one of the string select line SSLu or the string select line SSLd may be respective portions of a same second layer.

In an embodiment, the width of the plurality of vertical channels VC' in a horizontal direction (e.g., the thickness) may be equal to the width of a plurality of string select transistor structures SSLSa in the horizontal direction. Alternatively, in an embodiment, the width of the plurality of vertical channels VC' in the horizontal direction may be different from the width of the plurality of string select transistor structures SSLSa in the horizontal direction. For example, the width of the plurality of vertical channels VC' may be greater than or less than the width of the plurality of string select transistor structures SSLSa.

Figure 12:
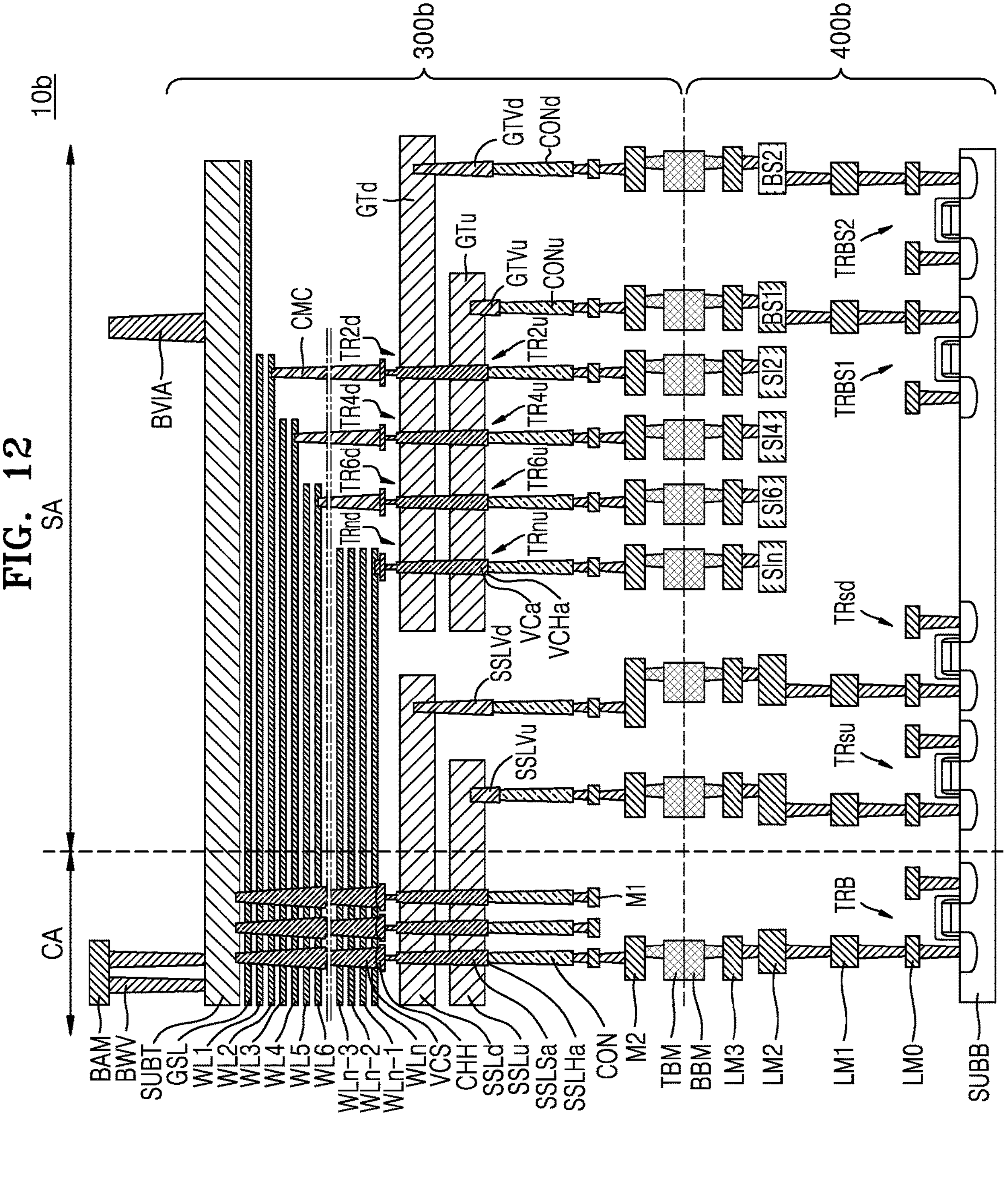
FIG. 12 is a view illustrating the structure of a memory device according to an embodiment.

FIG. 12 is a view illustrating the structure of a memory device 10*b* according to an embodiment. With respect to FIG. 12, redundant descriptions of the same reference numerals as in FIGS. 7 and 10 are omitted.

Referring to FIG. 12, the memory device 10*b* may include a first semiconductor layer 300*b* and a second semiconductor layer 400*b* disposed under the first semiconductor layer 300*b*.

The second semiconductor layer 400*b* may include a plurality of circuit elements TRB, TRsu, TRsd, TRBS1, and TRBS2 formed on a substrate SUBB. For example, the second semiconductor layer 400*b* may include a first transistor TRBS1 connected to a first block select signal line BS1, and a second transistor TRBS2 connected to a second block select signal line BS2, and the first and second transistors TRBS1 and TRBS2 may be included in a row decoder (e.g., the row decoder 220 of FIG. 1).

A first via GTVu may be formed to apply a voltage to a first gate GTu. The first gate GTu may be electrically connected to the first transistor TRBS1 formed in the second semiconductor layer 400*b* through the first via GTVu, a first contact CONu, a plurality of metal layers M1 and M2, and a bonding metal TBM of the first semiconductor layer 300*b* and through a bonding metal BBM and a plurality of metal layers LM0 to LM3 of the second semiconductor layer 400*b*.

A second via GTVd may be formed to apply a voltage to a second gate GTd. The second gate GTd may be electrically connected to the second transistor TRBS2 formed in the second semiconductor layer 400*b* through the second via GTVd, a second contact CONd, the plurality of metal layers M1 and M2, and the bonding metal TBM of the first semiconductor layer 300*b* and through the bonding metal BBM and the plurality of metal layers LM0 to LM3 of the second semiconductor layer 400*b*.

The first gate GTu may be connected to the first transistor TRBS1 and the first block select signal line BS, and the second gate GTd may be connected to the second transistor TRBS2 and the second block select signal line BS2. Pass transistors TR2*u*, TR4*u*, TR6*u*, and TRnu connected to the first gate GTu and pass transistors TR2*d*, TR4*d*, TR6*d*, and TRnd connected to the second gate GTd may be individually controlled.

Figure 13:
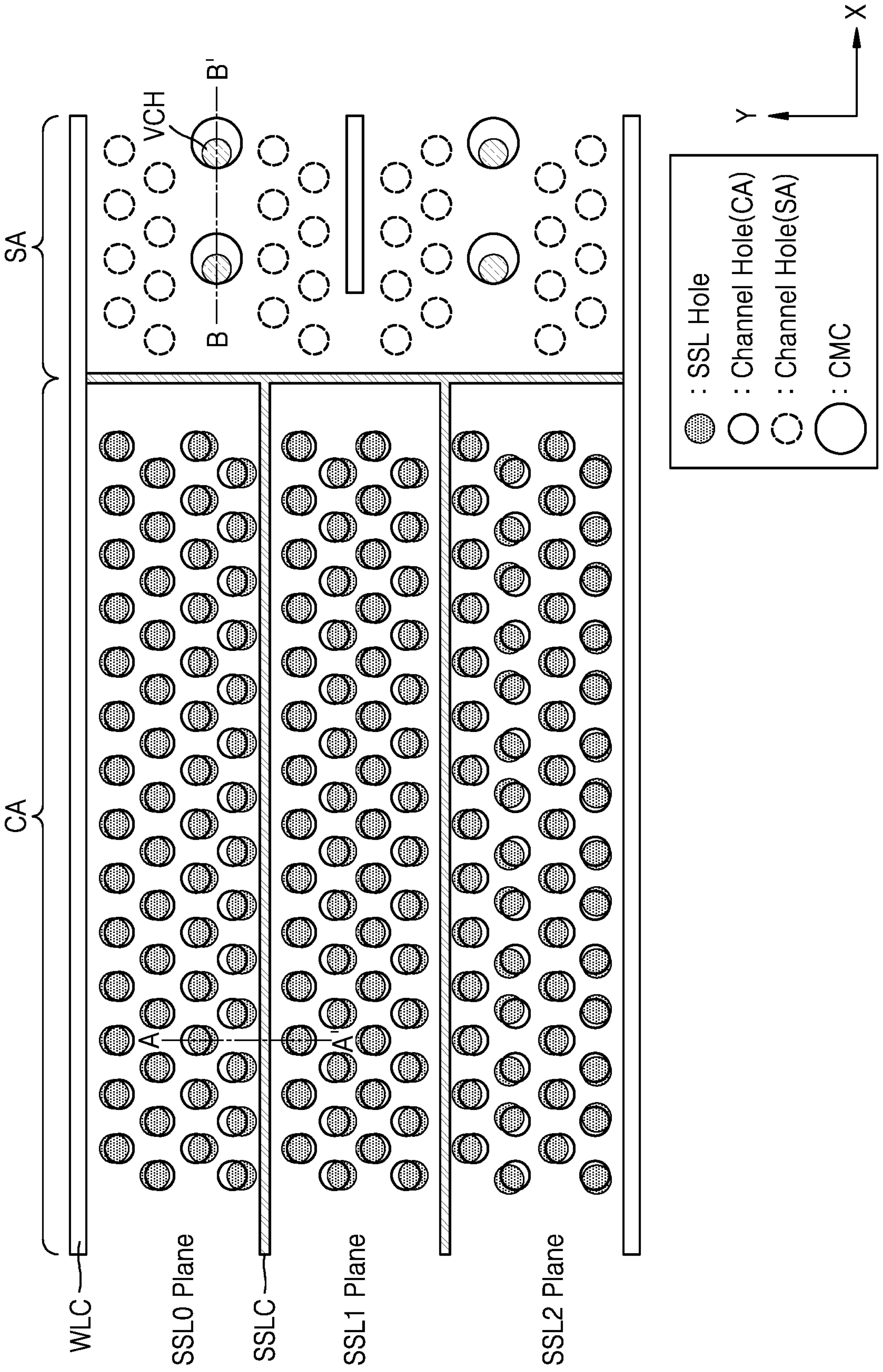
FIG. 13 is a schematic plan view of a partial region of a memory device according to an embodiment.
Figure 14:
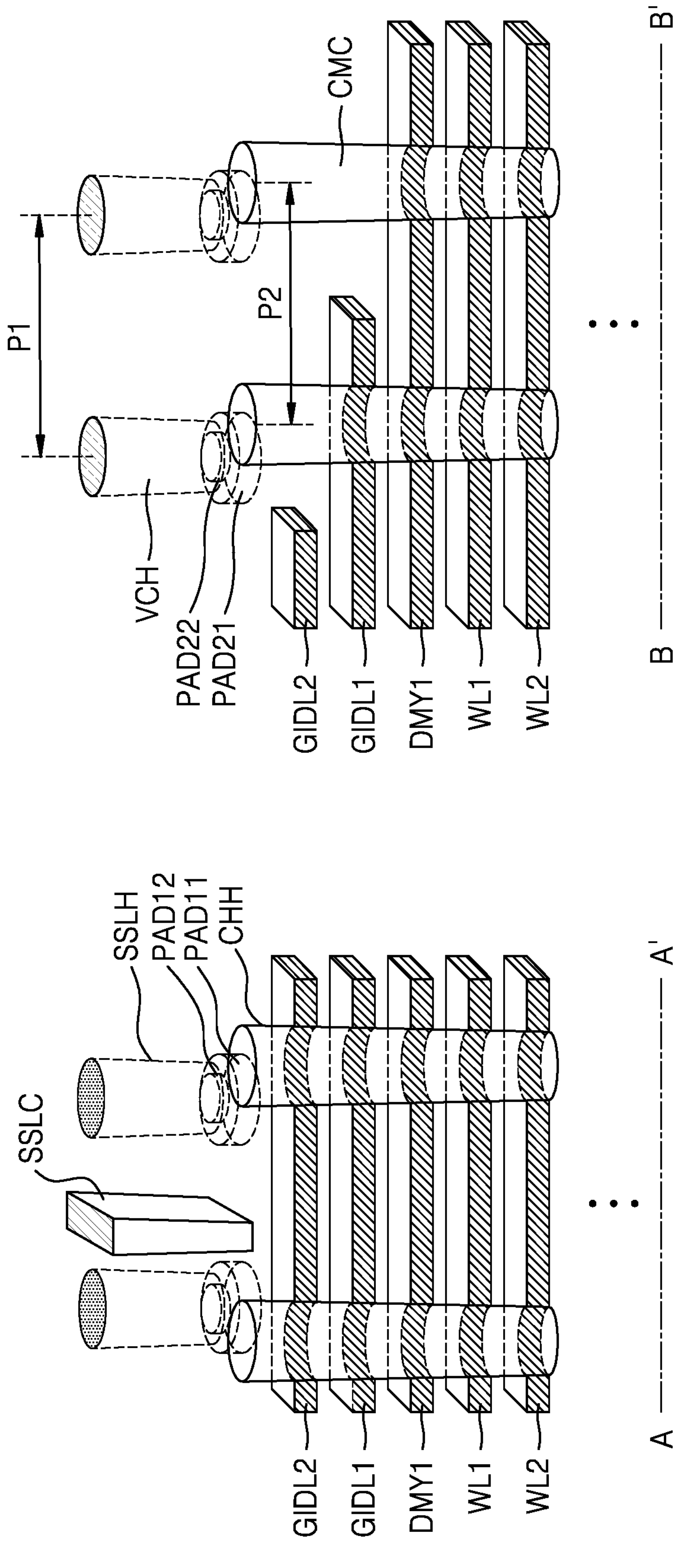
FIG. 14 illustrates cross-sectional views respectively taken along line A-A' and line B-B' of FIG. 13.

FIG. 13 is a schematic plan view of a partial region of a memory device according to an embodiment. FIG. 14 illustrates cross-sectional views respectively taken along line A-A' and line B-B' of FIG. 13. FIG. 13 is a plan view of each of the first semiconductor layers 300, 300*a*, 300*a*', and 300*b* including the cell area CA and the stair area SA, described above.

Referring to FIGS. 13 and 14, a plurality of word line cut areas WLC extending in a first horizontal direction (an X-axis direction) may be disposed in the cell area CA and the stair area SA. The plurality of word line cut areas WLC may be disposed to be spaced apart from each other in a second horizontal direction (a Y-axis direction), and each of a plurality of memory cell blocks (e.g., the memory cell blocks BLK1 to BLKz of FIG. 1) may be disposed between each two of the plurality of word line cut areas WLC.

A string select line cut area SSLC may be disposed in the cell area CA and the boundary between the cell area CA and the stair area SA. An SSL0 plane, an SSL1 plane, and an SSL2 plane may be separated from each other in one memory cell block by the string select line cut area SSLC. The word line cut areas WLC and the string select line cut area SSLC may each include an insulating material and may each include, for example, an oxide layer, a nitride layer, or a combination thereof. In some embodiments, at least a portion of each of the word line cut areas WLC and the string select line cut area SSLC may be filled with an air gap.

Channel holes CHH may be disposed in the cell area CA and the stair area SA. Vertical channel structures (e.g., the vertical channel structures VCS of FIG. 7) may be formed in channel holes CHH disposed in the cell area CA, and memory cells may be formed in the channel holes CHH disposed in the cell area CA. On the other hand, channel holes CHH in the stair area SA are dummy holes and do not include memory cells, but may be formed for structural stability of the memory device.

A plurality of string select line holes SSLH may be disposed on the channel holes CHH in the cell area CA. A plurality of string select transistor structures (e.g., the string select transistor structures SSLS of FIG. 7) may be formed in the plurality of string select line holes SSLH, and may each be formed to be surrounded by a corresponding string select line (one of string select lines SSL0, SSL1, and SSL2).

The plurality of channel holes CHH and the plurality of string select line holes SSLH may be formed through separate processes. In some cases, the plurality of channel holes CHH and the plurality of string select line holes SSLH may not be precisely aligned. The channel structures formed in the plurality of channel holes CHH may be electrically connected to the string select transistor structures formed in the plurality of string select line holes SSLH via at least one pad, for example, a first pad PAD11 and a second pad PAD12.

A plurality of vertical holes VCH in which pass transistors are formed may be formed in the stair area SA. In an embodiment, the plurality of vertical holes VCH may be formed through the same process as the plurality of string select line holes SSLH. For example, the plurality of vertical holes VCH and the plurality of string select line holes SSLH may have the same cross-section in a horizontal direction of a substrate in the memory device. However, in an embodiment, the plurality of vertical holes VCH and the plurality of string select line holes SSLH may have different cross-sections in the horizontal direction of the substrate.

Vertical channels (e.g., the vertical channels VC of FIG. 7) may be formed inside the plurality of vertical holes VCH, and may each be formed to be surrounded by a corresponding gate (e.g., the gate of FIG. 7). A plurality of cell contact plugs CMC electrically connected to pass transistors may be formed in the stair area SA. The vertical structure formed in the plurality of vertical holes VCH may be electrically connected to the plurality of cell contact plugs CMC via at least one pad, for example, a first pad PAD21 and a second pad PAD22. In an embodiment, a first pitch P1 between the plurality of vertical holes VCH may be equal to a second pitch P2 between the plurality of cell contact plugs CMC.

In an embodiment, gate induced drain leakage (GIDL) gate lines GIDL1 and GIDL2 and a dummy word line DMY1 may be disposed between a string select line and a word line WL, and each of the channel holes CHH may be formed to pass through the word line WL, the GIDL gate lines GIDL1 and GIDL2, and the dummy word line DMY1. However, the GIDL gate lines GIDL1 and GIDL2 and the dummy word line DMY1 shown in FIG. 14 are just examples, and the inventive concept is not limited thereto. In some embodiments, the number of GIDL gate lines and the number of dummy word lines may be variously modified, and/or the arrangement of the GIDL gate lines and dummy word lines may also be variously modified.

Figure 15:
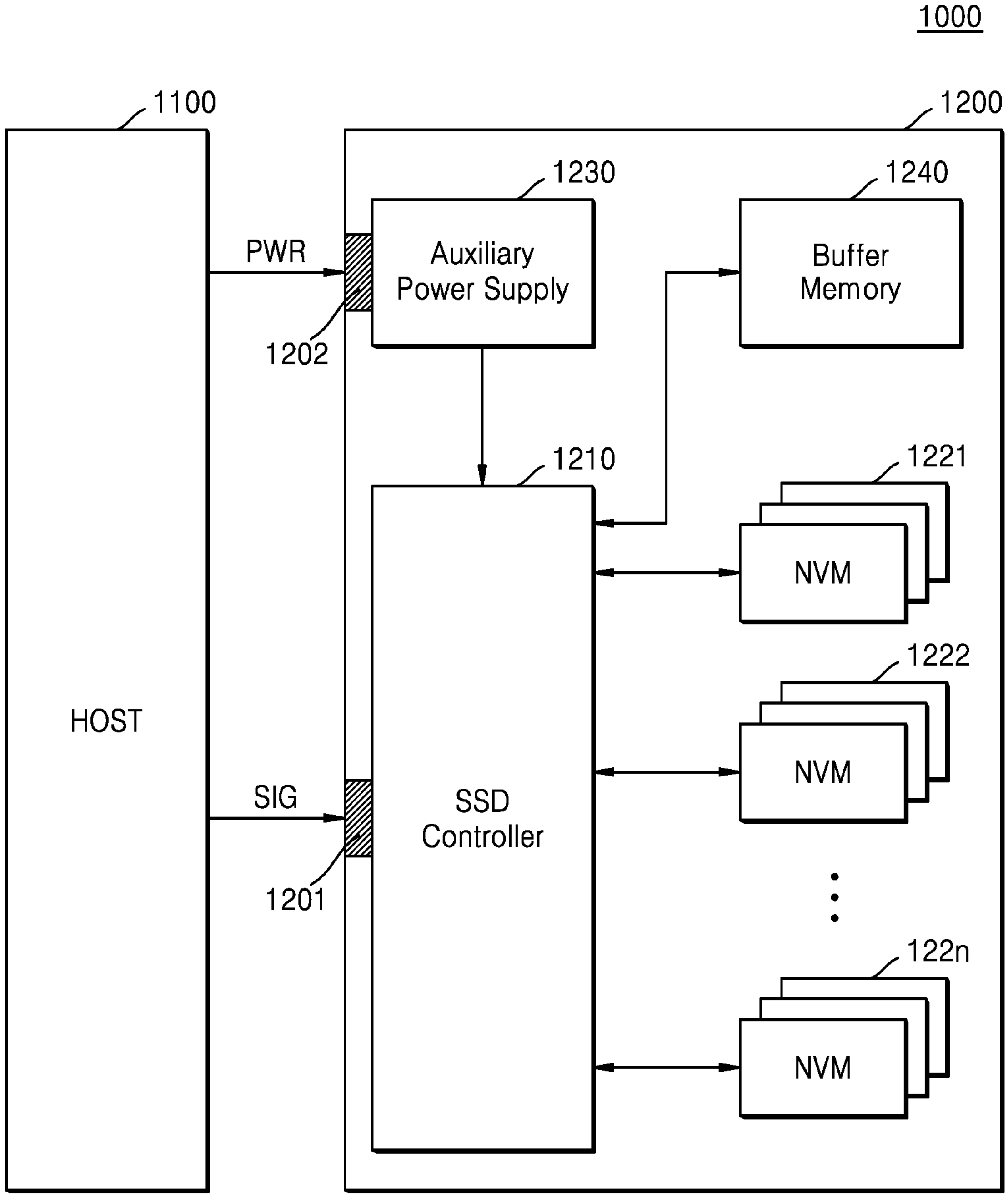
FIG. 15 is a block diagram of a solid state drive (SSD) system to which a memory device according to an embodiment is applied.

FIG. 15 is a block diagram of a solid state drive (SSD) system 1000 to which a memory device according to an embodiment is applied.

Referring to FIG. 15, the SSD system 1000 may include a host 1100 and an SSD 1200. The SSD 1200 transmits and receives signals to and from the host 1100 through a signal connector 1201 and receives power through a power connector 1202. The SSD 1200 may include an SSD controller 1210, an auxiliary power supply 1230, a buffer memory 1240, and memory devices 1221, 1222, and 122*n*. The memory devices 1221, 1222, and 122*n* may be vertically stacked NAND flash memory devices. In this case, the SSD 1200 may be implemented using the embodiments described above with reference to FIGS. 1 to 14.

While the inventive concepts have been particularly shown and described with reference to embodiments thereof, it will be understood that various changes in form and details may be made therein without departing from the scope of the following claims.

What is claimed is:

1. A non-volatile memory device comprising:

a first semiconductor layer comprising a cell area that includes a memory cell array, and a stair area adjacent to the cell area; and a second semiconductor layer stacked on the first semiconductor layer in a vertical direction and comprising a row decoder, wherein the first semiconductor layer comprises:

a plurality of word lines stacked in the vertical direction;

a layer comprising at least one string select line stacked on the plurality of word lines; and a plurality of first pass transistors disposed in the stair area, wherein each of the plurality of first pass transistors comprises a gate and a vertical channel extending in the vertical direction, wherein the gate is at a same level as the at least one string select line relative to a substrate, wherein, in the stair area, the plurality of word lines have a stepped shape, and wherein the plurality of first pass transistors electrically connect the plurality of word lines to the row decoder.

2. The non-volatile memory device of claim 1, wherein the at least one string select line is between the plurality of word lines and a bonding surface between the first semiconductor layer and the second semiconductor layer.

3. The non-volatile memory device of claim 1, wherein the row decoder is configured to provide a word line driving signal to the plurality of word lines through a plurality of word line driving signal lines, wherein the plurality of word line driving signal lines are in the first semiconductor layer or the second semiconductor layer.

4. The non-volatile memory device of claim 1, wherein the gate comprises a portion of the layer comprising the at least one string select line, wherein the row decoder is configured to provide a block select signal to the gate through a block select signal line, wherein the block select signal line is in the second semiconductor layer.

5. The non-volatile memory device of claim 1, wherein the second semiconductor layer comprises a second pass transistor electrically connecting the at least one string select line to the row decoder.

6. The non-volatile memory device of claim 1, wherein the layer comprising the at least one string select line comprises a first layer including a first string select line and a second layer including a second string select line that are sequentially stacked, wherein the gate of each of the plurality of first pass transistors comprises:

a first gate on a portion of the first layer; and a second gate on a portion of the second layer, wherein the vertical channel extends in the vertical direction through the first gate and the second gate.

7. The non-volatile memory device of claim 6, wherein the first gate and the second gate are configured to receive a same block select signal.

8. The non-volatile memory device of claim 6, wherein the first gate is configured to receive a first block select signal and the second gate is configured to receive a second block select signal.

9. The non-volatile memory device of claim 1, wherein the cell area comprises:

a plurality of vertical channel structures passing through the plurality of word lines;

a plurality of string select transistor structures passing through the at least one string select line; and a plurality of pads electrically connecting the plurality of vertical channel structures to the plurality of string select transistor structures.

10. A non-volatile memory device comprising:

a first semiconductor layer comprising a memory cell array that includes a plurality of vertical channel structures; and a second semiconductor layer stacked on the first semiconductor layer in a vertical direction and comprising a row decoder, wherein the first semiconductor layer comprises:

a plurality of word lines stacked in the vertical direction;

a layer comprising at least one string select line stacked on the plurality of word lines; and a plurality of pass transistors, wherein each of the plurality of pass transistors comprises a gate and a vertical channel extending in the vertical direction, wherein the gate is at a same level as the at least one string select line relative to a substrate, wherein the plurality of pass transistors electrically connect the plurality of word lines to the row decoder.

11. The non-volatile memory device of claim 10, wherein the gate comprises a portion of the layer comprising the at least one string select line, wherein the first semiconductor layer further comprises a plurality of cell contact plugs electrically connecting the plurality of pass transistors to the plurality of word lines, wherein a pitch between adjacent ones of the vertical channels of the plurality of pass transistors is equal to a pitch between adjacent ones of the cell contact plugs.

12. The non-volatile memory device of claim 10, wherein the first semiconductor layer further comprises:

a plurality of string select transistor structures passing through the at least one string select line; and a plurality of pads electrically connecting the plurality of vertical channel structures to the plurality of string select transistor structures.

13. The non-volatile memory device of claim 10, wherein respective widths of the plurality of word lines in the vertical direction are less than a width of the at least one string select line in the vertical direction.

14. The non-volatile memory device of claim 10, wherein the layer comprising the at least one string select line comprises a first layer including a first string select line and a second layer including a second string select line that are sequentially stacked, wherein the gate of each of the plurality of pass transistors comprises:

a first gate on a portion of the first laver; and a second gate on a portion of the second layer, wherein the vertical channel extends in the vertical direction through the first gate and the second gate.

15. The non-volatile memory device of claim 14, wherein the first gate and the second gate are electrically connected to one block select transistor that is configured to provide a block select signal.

16. The non-volatile memory device of claim 14, wherein the first gate is electrically connected to a first block select transistor that is configured to provide a first block select signal, and the second gate is electrically connected to a second block select transistor that is configured to provide a second block select signal.

17. A non-volatile memory device comprising:

a first semiconductor layer comprising a memory cell array; and a second semiconductor layer stacked on the first semiconductor layer in a vertical direction and comprising a row decoder, wherein the first semiconductor layer comprises:

a plurality of word lines stacked in the vertical direction;

a layer comprising at least one string select line between the plurality of word lines and a bonding surface between the first semiconductor layer and the second semiconductor layer; and a plurality of first pass transistors, wherein each of the plurality of first pass transistors comprises a gate and a vertical channel extending in the vertical direction, wherein the gate is at a same level as the at least one string select line relative to a substrate, wherein the plurality of first pass transistors electrically connect the plurality of word lines to the row decoder.

18. The non-volatile memory device of claim 17, wherein the second semiconductor layer comprises a second pass transistor electrically connecting the at least one string select line to the row decoder.

* * * * *